US012295226B2

(12) United States Patent
Chen et al.

(10) Patent No.: US 12,295,226 B2
(45) Date of Patent: May 6, 2025

(54) DISPLAY PANEL, METHOD OF MANUFACTURING THE SAME AND DISPLAY DEVICE

(71) Applicant: BOE Technology Group Co., Ltd., Beijing (CN)

(72) Inventors: Yipeng Chen, Beijing (CN); Lujiang Huangfu, Beijing (CN); Libin Liu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 505 days.

(21) Appl. No.: 17/762,692

(22) PCT Filed: Apr. 15, 2021

(86) PCT No.: PCT/CN2021/087366
§ 371 (c)(1),
(2) Date: Mar. 22, 2022

(87) PCT Pub. No.: WO2021/227758
PCT Pub. Date: Nov. 18, 2021

(65) Prior Publication Data
US 2022/0367596 A1 Nov. 17, 2022

(30) Foreign Application Priority Data
May 9, 2020 (CN) .......................... 202010387363.0

(51) Int. Cl.
H01L 27/32 (2006.01)
H10K 59/121 (2023.01)
(Continued)

(52) U.S. Cl.
CPC ....... *H10K 59/131* (2023.02); *H10K 59/1213* (2023.02); *H10K 59/1216* (2023.02); *H10K 59/126* (2023.02); *H10K 59/1201* (2023.02)

(58) Field of Classification Search
CPC ............. H10K 59/126; H10K 59/1216; G09G 3/3291; G09G 3/3233; G09G 2300/0861; G09G 2300/0819
See application file for complete search history.

(56) References Cited

U.S. PATENT DOCUMENTS 11,522,027 B2 * 12/2022 Lee ....................... G06F 3/0412
11,751,460 B2 * 9/2023 Chen ................... H10K 59/353
345/55
(Continued)

FOREIGN PATENT DOCUMENTS

CN 101154348 A 4/2008
CN 106910468 A 6/2017
(Continued)

OTHER PUBLICATIONS

PCT/CN2021/087366 international search report and written opinion.
(Continued)

Primary Examiner — Olga V Merkoulova
(74) Attorney, Agent, or Firm — IPro, PLLC

(57) ABSTRACT

The present disclosure provides a display panel and a method of manufacturing the same and a display device. In a sub-pixel driving circuit of the display panel, a gate electrode of a driving transistor is coupled to a second electrode of a second transistor through a fourth conductive connection portion, and a second electrode plate of a storage capacitor is coupled to a second electrode of a first transistor through a third conductive connection portion, a gate electrode of the first transistor and a gate electrode of the second transistor are respectively coupled to a gate line pattern in the corresponding sub-pixel area; orthographic projection of the gate line pattern on the substrate does not overlap orthographic projection of the third conductive connecting
(Continued)

portion on the substrate, and/or does not overlap orthographic projection of the fourth conductive connection portion on the substrate.

13 Claims, 13 Drawing Sheets

(51) Int. Cl.
  *H10K 59/126* (2023.01)
  *H10K 59/131* (2023.01)
  *H10K 59/12* (2023.01)

(56) References Cited

U.S. PATENT DOCUMENTS

| | | | | |
|---|---|---|---|---|
| 11,805,682 B2* | 10/2023 | Chen | ............ | G09G 3/3233 |
| 11,903,289 B2* | 2/2024 | Chen | ............ | H10K 59/352 |
| 11,950,468 B2* | 4/2024 | Chen | ............ | H10K 59/131 |
| 2004/0135952 A1* | 7/2004 | Kurashina | ......... | G02F 1/136227 |
| | | | | 349/110 |
| 2005/0146649 A1* | 7/2005 | Sato | ............ | G02F 1/136209 |
| | | | | 349/44 |
| 2010/0123846 A1* | 5/2010 | Kim | ............ | G02F 1/13458 |
| | | | | 349/147 |
| 2011/0108830 A1* | 5/2011 | Park | ............ | H01L 29/7869 |
| | | | | 257/E29.296 |
| 2016/0321994 A1 | 11/2016 | Lee | | |
| 2018/0047337 A1 | 2/2018 | Zhu et al. | | |
| 2018/0350891 A1* | 12/2018 | Kim | ............ | H10K 59/131 |
| 2019/0051669 A1* | 2/2019 | Lee | ............ | H01L 27/1262 |
| 2020/0227500 A1* | 7/2020 | Chen | ............ | G09G 3/3291 |
| 2021/0335959 A1* | 10/2021 | Chen | ............ | H10K 59/126 |
| 2022/0367596 A1 | 11/2022 | Chen et al. | | |

FOREIGN PATENT DOCUMENTS

| | | |
|---|---|---|
| CN | 109742092 A | 5/2019 |
| CN | 111508977 A | 8/2020 |
| CN | 111508978 A | 8/2020 |

OTHER PUBLICATIONS

U.S. Appl. No. 18/107,991 non-final office action dated Sep. 9, 2024.

* cited by examiner

DISPLAY PANEL, METHOD OF MANUFACTURING THE SAME AND DISPLAY DEVICE

CROSS-REFERENCE TO RELATED APPLICATION

This application claims is the U.S. national phase of PCT Application No. PCT/CN2021/087366 filed on Apr. 15, 2021, which priorities of the Chinese patent application No. 202010387363.0 filed on May 9, 2020, which is incorporated herein by reference in its entity.

TECHNICAL FIELD

The present disclosure relates to the field of display technology, and more particularly to a display panel, a method of manufacturing the same and a display device.

BACKGROUND

Active-matrix organic light emitting diode (AMOLED) display panels are widely used in various fields due to their advantages of self-luminescence, low power consumption, and fast response speed. The AMOLED display panel includes a sub-pixel driving circuit and a light emitting unit, and the corresponding light emitting unit is driven to emit light through the sub-pixel driving circuit to realize the display function of the display panel.

However, as the resolution of the display panel becomes higher and higher, the layout space in the display panel becomes smaller and smaller, so that the distance between the gate electrode of the driving transistor in the sub-pixel driving circuit laid out in the display panel and the data line patterns for providing the data signal to the sub-pixel driving circuit is relatively close, which is prone to generate parasitic capacitance. In this way, when the display panel is in the light emitting state, the voltage jump of the data signal will drive the gate voltage of the driving transistor to change through the parasitic capacitance, which will cause the brightness of some areas of the display panel to be abnormal and affect the display quality of the display panel.

SUMMARY

The objective of the disclosed solution is to provide a display panel, a method of manufacturing the same, and a display device.

In order to achieve the above objective, the following technical solutions are provided by the present disclosure.

In a first aspect, a display panel, includes: a substrate and a sub-pixel driving circuit film layer, a gate line layer, a data line layer, and a conductive connection portion layer disposed on the substrate, and a plurality of sub-pixel areas arranged in an array; wherein the gate line layer includes a gate line pattern located in each of the plurality of sub-pixel areas, and at least part of the gate line pattern extends along a first direction; the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate; the conductive connection portion layer includes a third conductive connection portion and a fourth conductive connection portion located in each of the plurality of sub-pixel areas; the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate.

Optionally, the display panel further includes a power signal line layer, wherein the power signal line layer includes a power signal line pattern located in each of the plurality of the sub-pixel areas, at least part of the power signal line pattern extends along the second direction; a first shielding layer, wherein the first shielding layer includes a first shielding pattern located in each of the plurality of sub-pixel areas, the first shielding pattern is coupled to the power signal line pattern, and at least part of the first shielding pattern extends along the second direction, and orthographic projection of the first shielding pattern on the substrate overlaps orthographic projection of the data line pattern on the substrate.

Optionally, the display panel further includes a third auxiliary signal line layer, wherein the third auxiliary signal line layer includes a third auxiliary signal line pattern located in each of the plurality of sub-pixel areas, at least part of the third auxiliary signal line pattern extends along the first direction; in a same sub-pixel area, a fourth overlapping area is formed between orthographic projection of the third auxiliary signal line pattern on the substrate and orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled; in the same sub-pixel area, the first shielding pattern and the third auxiliary signal line pattern are formed as an integral structure.

Optionally, the display panel further includes a power signal line layer, wherein the power signal line layer includes a power signal line pattern located in each of the plurality of sub-pixel areas, at least part of the power signal line pattern extends along the second direction; in the same sub-pixel area, the orthographic projection of the power signal line pattern on the substrate is located between orthographic projection of the gate electrode of the driving transistor on the substrate and the orthographic projection of the data line pattern on the substrate.

Optionally, the power signal line pattern includes a first power supply portion and a second power supply portion that are coupled to each other, and the first power supply portion extends along the second direction, the second power supply portion protrudes from the first power supply portion in a direction away from the data line pattern in the sub-pixel area where the second power supply portion is located; in a direction perpendicular to the second direction and parallel to a direction of the substrate, a width of the first power supply portion is greater than a width of the second power supply portion; orthographic projection of the first electrode of the driving transistor on the substrate overlaps orthographic projection of the first power supply portion in the corresponding sub-pixel area on the substrate, and the first electrode of the driving transistor is coupled to the first power supply portion at the overlapping area.

Optionally, the first electrode of the first transistor includes a first electrode portion and a second electrode portion that are coupled to each other, and the first electrode portion extends along the first direction, the second electrode portion extends along the second direction, orthographic projection of the second electrode portion on the substrate overlaps the orthographic projection of the data line pattern in the corresponding sub-pixel area on the substrate, and the second electrode portion is coupled to the data line pattern in the corresponding sub-pixel area through a first connection hole at the overlapping area; orthographic projection of the first connection hole on the substrate and the orthographic projection of the second power supply portion on the substrate are arranged in a direction perpendicular to the second direction.

Optionally, orthographic projection of the first electrode portion on the substrate overlaps the orthographic projection of the first power supply portion in the corresponding sub-pixel area on the substrate; and/or, orthographic projection of a channel area of the first transistor on the substrate overlaps the orthographic projection of the first power supply portion in the corresponding sub-pixel area on the substrate.

Optionally, the display panel further includes an initialization signal line layer, wherein the initialization signal line layer includes an initialization signal line pattern arranged in each of the plurality of sub-pixel areas; an anode layer located on a side of the initialization signal line layer away from the substrate, wherein the anode layer includes a plurality of anode patterns corresponding to the plurality of sub-pixel areas in a one-to-one manner, and the plurality of anode patterns are arranged at intervals, an anode spacing area is formed between adjacent anode patterns; a first auxiliary signal line layer, wherein the first auxiliary signal line layer has a grid structure, at least a part of the first auxiliary signal line layer is located in the anode spacing area and is insulated from the anode pattern, the initialization signal line pattern in each of the plurality of sub-pixel areas is coupled to the first auxiliary signal line layer.

Optionally, the conductive connection portion layer further includes a first conductive connection portion arranged in each of the plurality of sub-pixel areas; in the same sub-pixel area, a first overlapping area is formed between the orthographic projection of the first conductive connecting portion on the substrate and the orthographic projection of the initialization signal line pattern on the substrate, a second overlapping area is formed between the orthographic projection of the first conductive connection portion on the substrate and the first auxiliary signal line layer; the first conductive connection portion is coupled to the initialization signal line pattern in the first overlapping area, and the first conductive connection portion is coupled to the first auxiliary signal line layer in the second overlapping area.

Optionally, each initialization signal line pattern includes a first sub-pattern and a second sub-pattern, and in adjacent sub-pixel areas of the same row along the first direction, a second sub-pattern in a previous sub-pixel area and a first sub-pattern in a current sub-pixel area form an integral structure; the second sub-pattern is coupled to the first auxiliary signal line layer in each sub-pixel area.

Optionally, the first auxiliary signal line layer and the anode layer are arranged at a same layer and made of a same material.

Optionally, the display panel further includes a reset signal line layer, wherein the reset signal line layer includes a reset signal line pattern located in each of the plurality of sub-pixel areas, and a gate line pattern in a current sub-pixel area and a reset signal line pattern in an adjacent next sub-pixel area along the second direction are formed as an integral structure.

Optionally, the display panel further includes a power signal line pattern, an initialization signal line pattern, a reset signal line pattern, and a light emitting control signal line pattern located in each of the plurality of sub-pixel areas; wherein each of the sub-pixel driving circuits further includes: a fourth transistor, a fifth transistor, a sixth transistor, a seventh transistor, an eighth transistor, and a ninth transistor; a first electrode of the first transistor is coupled to the corresponding data line pattern; a first electrode of the second transistor is coupled to the second electrode of the driving transistor; a first electrode of the driving transistor is coupled to the corresponding power signal line pattern; a gate electrode of the fourth transistor is coupled to the corresponding reset signal line pattern, a first electrode of the fourth transistor is coupled to the corresponding initialization signal line pattern, and a second electrode of the fourth transistor is coupled to the gate electrode of the driving transistor; a gate electrode of the fifth transistor is coupled to the corresponding reset signal line pattern, a first electrode of the fifth transistor is coupled to the corresponding initialization signal line pattern, and a second electrode of the fifth transistor is coupled to the second electrode plate of the storage capacitor; a gate electrode of the sixth transistor is coupled to the corresponding light emitting control signal line pattern, a first electrode of the sixth transistor is coupled to the corresponding initialization signal line pattern, and a second electrode of the sixth transistor is coupled to the second electrode plate of the storage capacitor; a gate electrode of the seventh transistor is coupled to the corresponding light emitting control signal line pattern, a first electrode of the seventh transistor is coupled to the second electrode of the driving transistor, and a second electrode of the seventh transistor is coupled to the corresponding anode pattern; a gate electrode of the eighth transistor is coupled to the corresponding reset signal line pattern, a first electrode of the eighth transistor is coupled to the corresponding initialization signal line pattern, and a second electrode of the eighth transistor is coupled to the corresponding anode pattern; a gate electrode of the ninth transistor is coupled to the corresponding light emitting control signal line pattern, a first electrode of the ninth transistor is coupled to the gate electrode of the third transistor, and a second electrode of the ninth transistor is floating.

Based on the technical solution of the display panel, in a second aspect, a display device includes the above display panel.

Based on the technical solution of the display panel, in a third aspect, a method of manufacturing a display panel includes forming a sub-pixel driving circuit film layer, a gate line layer, a data line layer and a conductive connection layer on a substrate, wherein the gate line layer includes a gate line pattern located in each of the plurality of sub-pixel areas, and at least part of the gate line pattern extends along a first direction; the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate; the conductive connection portion layer includes a third conductive connection portion and a fourth conductive connection portion located in each of the plurality of sub-pixel areas; the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate.

BRIEF DESCRIPTION OF THE DRAWINGS

The drawings described here are used to provide a further understanding of the present disclosure and constitute a part of the present disclosure. The exemplary embodiments and descriptions of the present disclosure are used to explain the present disclosure, and do not constitute an improper limitation of the present disclosure.

DETAILED DESCRIPTION

Figure 1A:
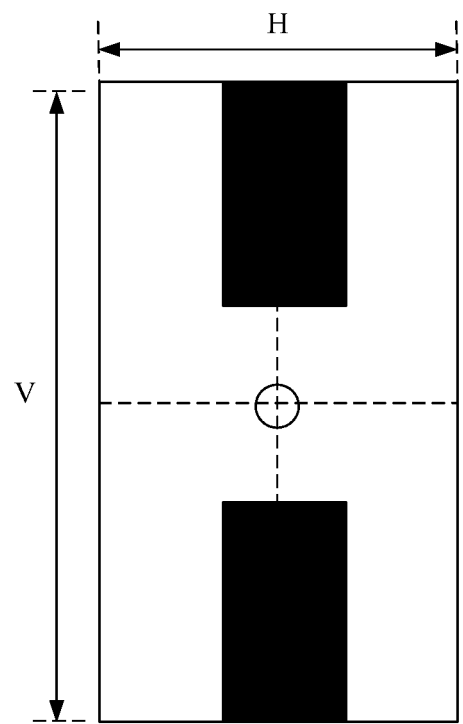
FIG. 1a shows a longitudinal crosstalk phenomenon generated when the display panel displays a first image in the related art.
Figure 1B:
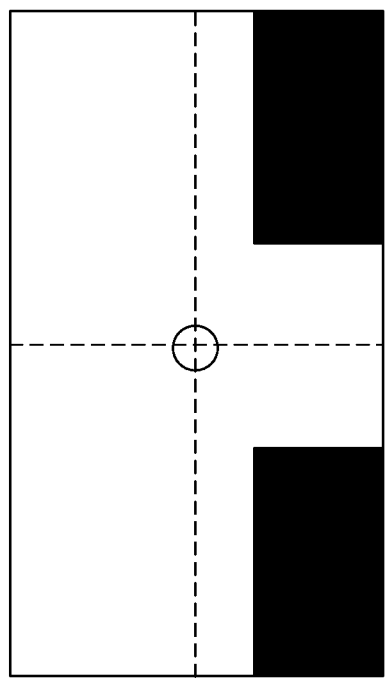
FIG. 1b shows a longitudinal crosstalk phenomenon generated when the display panel displays a second image in the related art
Figure 1C:
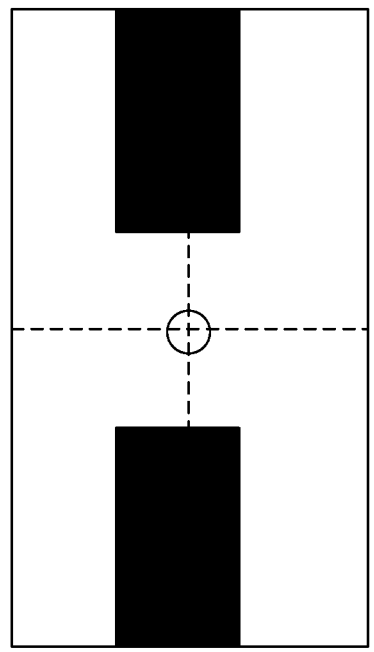
FIG. 1c shows a longitudinal crosstalk phenomenon generated when the display panel displays a third image in the related art.
Figure 1D:
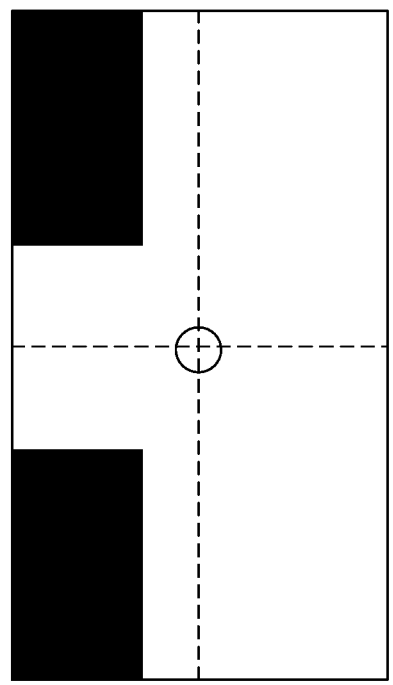
FIG. 1d shows a longitudinal crosstalk phenomenon generated when the display panel displays a fourth image in the related art.
Figure 1E:
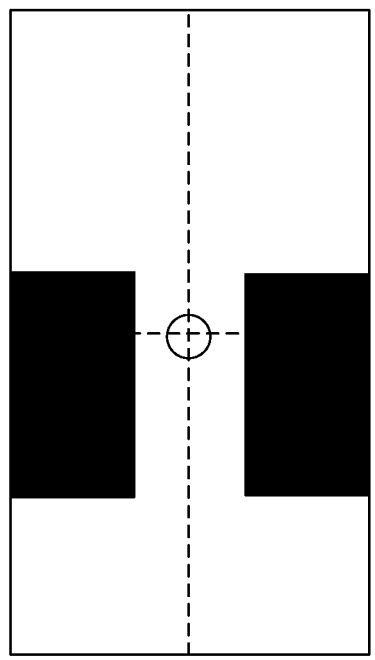
FIG. 1e shows a longitudinal crosstalk phenomenon generated when the display panel displays a fifth image in the related art.
Figure 1F:
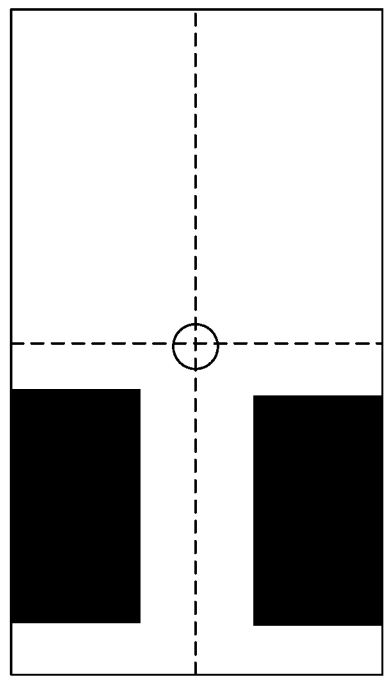
FIG. 1f shows a longitudinal crosstalk phenomenon generated when the display panel displays a sixth image in the related art.
Figure 1G:
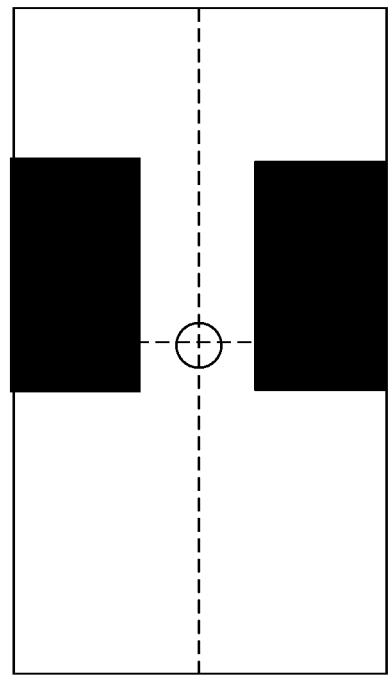
FIG. 1g shows a longitudinal crosstalk phenomenon generated when the display panel displays a seventh image in the related art.
Figure 1H:
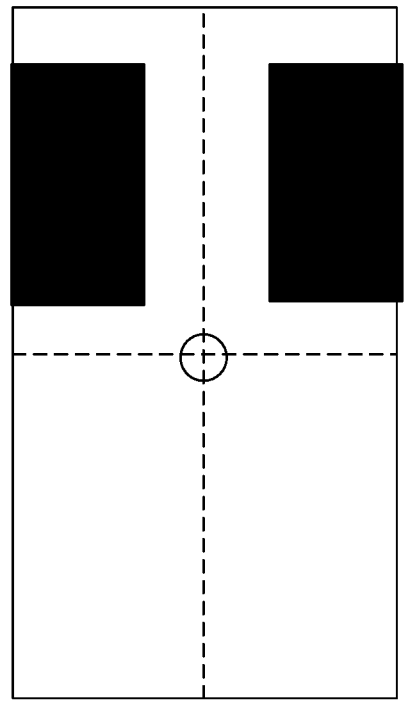
FIG. 1h shows a longitudinal crosstalk phenomenon generated when the display panel displays an eighth image in the related art.

In order to further explain the display panel and the manufacturing method thereof and the display device provided by the embodiments of the present disclosure, a detailed description will be given below in conjunction with the accompanying drawings of the disclosure.

Crosstalk is an important evaluation indicator for display panels. Crosstalk is divided into horizontal crosstalk (H-talk) and vertical crosstalk (V-talk). For a 9T1C (nine transistors and one storage capacitor) pixel circuit, V-talk is relatively serious. After analysis, when the sub-pixel driving circuit is compensated to drive the light emitting unit to be the light emitting state, the data voltage jump of the transmission line on the data line pattern will drive the gate electrode of the driving transistor in the sub-pixel driving circuit to change through the parasitic capacitance, so that the display brightness of some areas of the display panel is abnormal.

As shown in FIG. 1a-1d, the corresponding display brightness are shown when the display panel displays four images respectively. The black blocks in the figure represent the abnormal display area. It can be seen from the figure that there are longitudinal crosstalk phenomenon when the display panel displays four images. The calculation formula for calculating the longitudinal crosstalk parameter Crosstalk (V) of the display panel is as follows:

$$\text{Crosstalk}(V) = \max\left(\left|\frac{L_{V1} - L_{V2}}{L_{V2}}\right| \times 100, \left|\frac{L_{V3} - L_{V4}}{L_{V4}}\right| \times 100\right)$$

$L_{V1}$ represents the brightness of the center point (the center circle in the figure) when the display panel displays the first frame, $L_{V2}$ represents the brightness of the center point when the display panel displays the second frame, and $L_{V3}$ represents the brightness of the center point when the display panel displays the third frame. Brightness, $L_{V4}$ represents the brightness of the center point when the display panel displays the fourth frame.

As shown in FIG. 1e-1h, the corresponding display brightness are shown when the display panel displays four images respectively. The black blocks in the figure represent the abnormal display area. It can be seen from the figure that there are horizontal crosstalk phenomenon when the display panel displays four images. The calculation formula for calculating the horizontal crosstalk parameter Crosstalk(H) of the display panel is as follows:

$$\text{Crosstalk}(H) = \max\left(\left|\frac{L_{H1} - L_{H2}}{L_{H2}}\right| \times 100, \left|\frac{L_{H3} - L_{H4}}{L_{H4}}\right| \times 100\right)$$

$L_{H1}$ represents the brightness of the center point (the center circle in the figure) when the display panel displays the fifth image, $L_{H2}$ represents the brightness of the center point when the display panel displays the sixth image, and $L_{H3}$ represents the brightness of the center point when the display panel displays the seventh image. Brightness, $L_{H4}$ represents the brightness of the center point when the display panel displays the eighth image.

Figure 2:
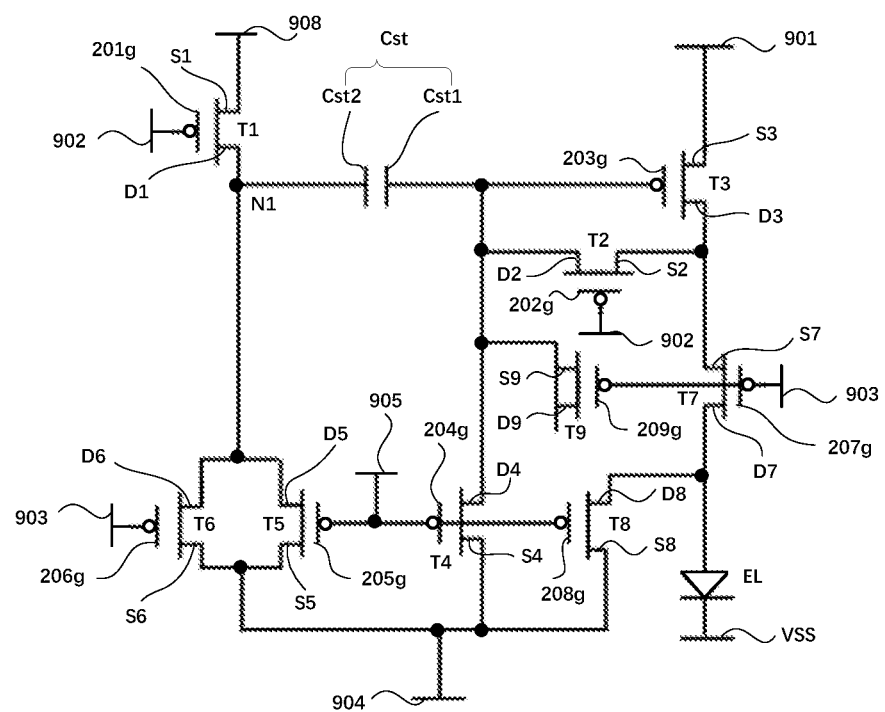
FIG. 2 is a circuit diagram of a sub-pixel driving circuit provided by an embodiment of the disclosure.
Figure 4:
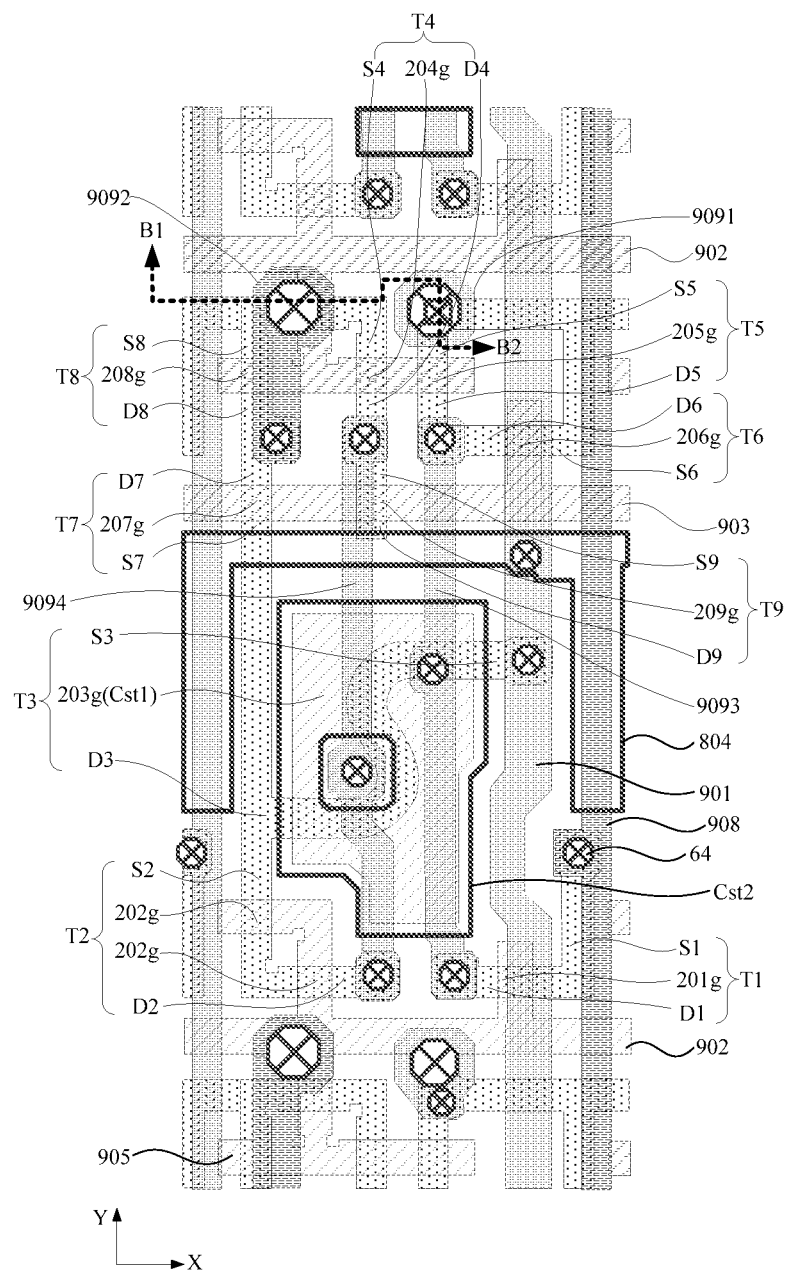
FIG. 4 is a schematic diagram of a layout of a sub-pixel driving circuit provided by an embodiment of the disclosure.
Figure 11:
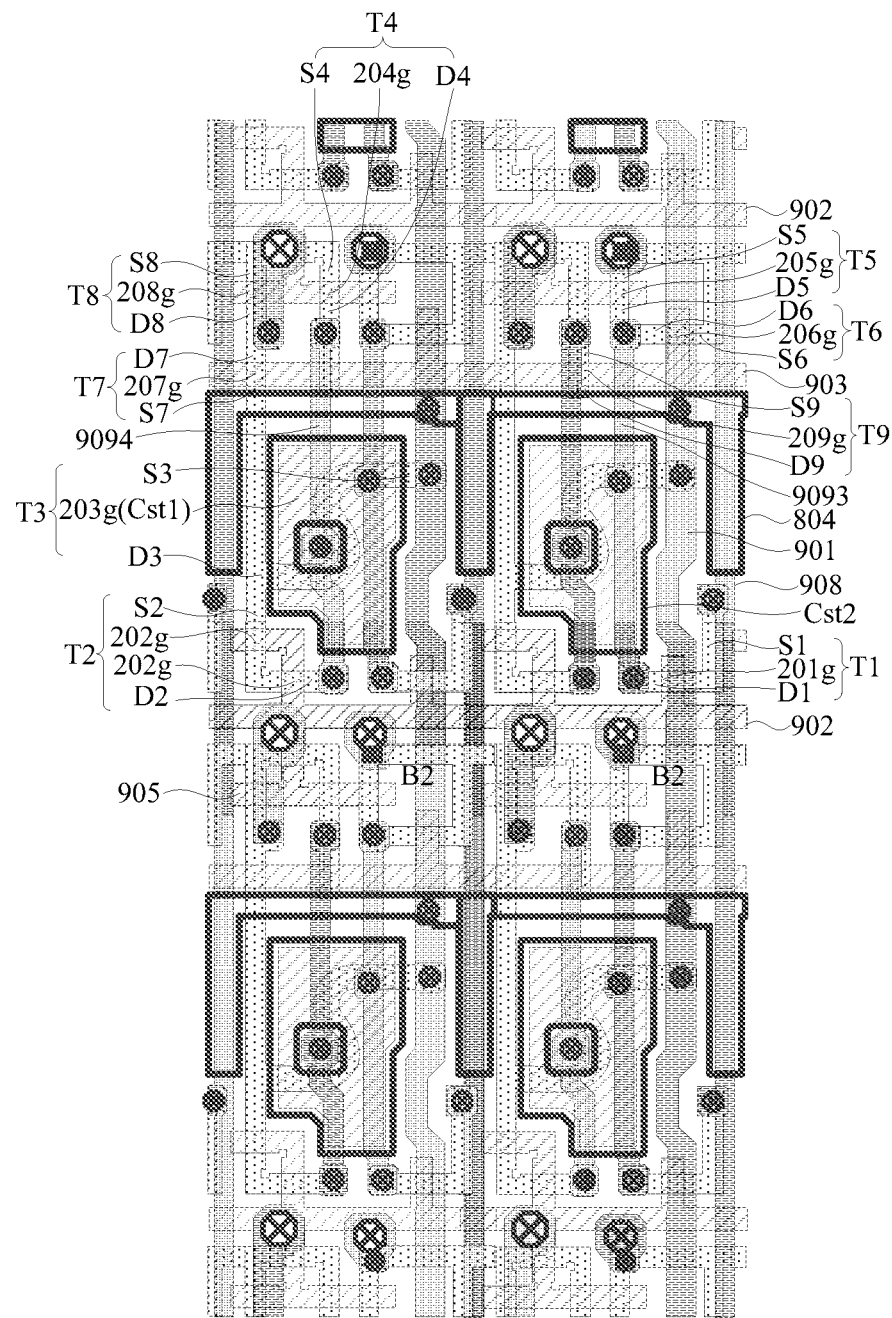
FIG. 11 is a schematic diagram of the layout of four sub-pixel areas provided by an embodiment of the disclosure.

Referring to FIG. 2, FIG. 4, and FIG. 11, an embodiment of the present disclosure provides a display panel, includes: a substrate and a sub-pixel driving circuit film layer, a gate line layer, a data line layer, and a conductive connection portion layer disposed on the substrate, and further includes a plurality of sub-pixel areas arranged in an array;

The gate line layer includes a gate line pattern 902 located in each of the sub-pixel areas, and at least part of the gate line pattern 902 extends along a first direction;

The data line layer includes a data line pattern 908 located in each of the sub-pixel areas, at least part of the data line pattern 908 extends along a second direction, the first direction intersects the second direction, and the orthographic projection of the data line pattern 908 on the substrate overlaps the orthographic projection of the gate line pattern 902 on the substrate;

The conductive connection portion layer includes a third conductive connection portion 9093 and a fourth conductive connection portion 9094 located in each of the sub-pixel areas;

The sub-pixel driving circuit film layer includes sub-pixel driving circuits corresponding to the sub-pixel areas in a one-to-one manner, and each of the sub-pixel driving circuits includes: a driving transistor (that is, a third transistor T3), a storage capacitor Cst, and a first transistor T1 and a second transistor T2; the gate electrode of the driving transistor is multiplexed as the first plate Cst1 of the storage capacitor Cst, and the gate electrode of the driving transistor is coupled to the second electrode D2 of the second transistor T2 through the fourth conductive connection portion 9094 in the corresponding sub-pixel area, and the second electrode plate Cst2 of the storage capacitor Cst is coupled to the second electrode D1 of the first transistor T1 through the third conductive connection portion 9093 in the corresponding sub-pixel area. The gate electrode 201g of the first transistor T1 and the gate electrode 202g of the second transistor T2 are respectively coupled to the gate line pattern 902 in the corresponding sub-pixel area; the orthographic projection of the gate line pattern 902 on the substrate does not overlap the orthographic projection of the third conductive connecting portion 9093 on the substrate, and/or the orthographic projection of the gate line pattern 902 on the substrate does not overlap the orthographic projection of the fourth conductive connection portion 9094 on the substrate.

Specifically, the plurality of sub-pixel areas arranged in an array can be divided into multiple rows of sub-pixel areas sequentially arranged along the second direction, and multiple columns of sub-pixel areas sequentially arranged along the first direction. Each row of sub-pixel areas includes a plurality of sub-pixel areas spaced along the first direction, and each column of sub-pixel areas includes a plurality of sub-pixel areas spaced along the second direction. The first direction intersects the second direction. Illustratively, the first direction includes the X direction, and the second direction includes the Y direction.

The gate line layer includes a plurality of gate line patterns 902, and the gate line patterns 902 correspond to the plurality of sub-pixel areas in a one-to-one manner. The gate line patterns 902 are located in the corresponding sub-pixel areas and are used for providing scanning signals to the sub-pixel driving circuits corresponding to the sub-pixel areas. At least part of each of the gate line patterns 902 extends along the first direction, and the gate line patterns 902 in the sub-pixel areas located in the same row along the first direction are electrically connected in sequence to form an integral structure.

The data line layer includes a plurality of data line patterns 908, and the data line patterns 908 correspond to the plurality of sub-pixel areas in a one-to-one manner, and the data line patterns 908 are located in the corresponding sub-pixel areas and are used for providing data signals to the sub-pixel driving circuits corresponding to the sub-pixel areas. At least a part of each of the data line patterns 908 extends along the second direction, and the data line patterns 908 in the sub-pixel areas located in the same column along the second direction are electrically connected in sequence to form an integral structure.

The conductive connection portion layer can be made of the first source-drain metal layer in the display panel, and the specific structure of the third conductive connection portion 9093 and the fourth conductive connection portion 9094 included in the conductive connection portion layer can be set based on actual conditions. Illustratively, at least part of the third conductive connection portion 9093 extends along the second direction, and at least part of the fourth conductive connection portion 9094 extends along the second direction.

The sub-pixel driving circuit film layer includes a plurality of sub-pixel driving circuits, and the sub-pixel driving circuits correspond to the sub-pixel areas in a one to one manner. Each of the sub-pixel driving circuits includes a driving transistor, a storage capacitor Cst, a first The transistor T1 and the second transistor T2; the driving transistor can generate a driving signal for driving the light emitting element to emit light, and the gate electrode of the driving transistor is coupled to the first electrode plate Cst1 of the storage capacitor Cst, for example, the gate electrode of the driving transistor can be multiplexed as the first electrode plate Cst1 of the storage capacitor Cst.

The gate electrode of the driving transistor can also be coupled to the second electrode D2 of the second transistor T2 through the fourth conductive connection portion 9094 in the corresponding sub-pixel area, and the first electrode S2 of the second transistor T2 is coupled to the second electrode of the driving transistor, and the gate electrode 202g of the second transistor T2 is coupled to the gate line pattern 902 in the corresponding sub-pixel area. The second electrode plate Cst2 of the storage capacitor Cst is coupled to the second electrode D1 of the first transistor T1 through the third conductive connection portion 9093 in the corresponding sub-pixel area, and the first electrode S1 of the first transistor T1 is coupled to the data line pattern 908 in the corresponding sub-pixel area, and the gate electrode 201g of the first transistor T1 is coupled to the gate line pattern 902 in the corresponding sub-pixel area.

Since the gate electrode of the driving transistor can be coupled to the second electrode D2 of the second transistor T2 through the fourth conductive connection portion 9094, and is coupled to the second electrode D1 of the first transistor T1 through the storage capacitor Cst and the third conductive connection portion 9093. Therefore, the signals on the third conductive connection portion 9093 and the fourth conductive connection portion 9094 can affect the gate signal of the driving transistor.

The above-mentioned arrangement that the orthographic projection of the data line pattern 908 on the substrate overlaps the orthographic projection of the gate line pattern 902 on the substrate, and the orthographic projection of the gate line pattern 902 on the substrate does not overlap the orthographic projection of the third conductive connecting portion 9093 on the substrate, and/or the orthographic projection of the grid line pattern 902 on the substrate does not overlaps the orthographic projection of the fourth conductive connecting portion 9094 on the substrate, in the same sub-pixel area, in the direction perpendicular to the substrate, the gate line pattern 902 can only overlap the data line pattern 908, but does not overlap the third conductive connection portion 9093 and/or the fourth conductive connection portion 9094, thereby preventing a series parasitic electricity formed by the data line pattern 908 and the third conductive connection portion 9093 and/or the fourth conductive connection portion 9094 through the gate line pattern 902, which effectively improves the crosstalk problem of the gate voltage change of the driving transistor caused by the jump of the data signal transmitted on the data line pattern 908.

Therefore, in the display panel provided by the embodiment of the present disclosure, when the display panel is in the light emitting state, even if the jump of the voltage of the data signal transmitted on the data line pattern 908 occurs, the change of the gate voltage of the driving transistor driven by the parasitic capacitance will not occur, thereby ensuring the stability of the gate voltage of the driving transistor, and effectively improving the display quality of the display panel.

Figure 7:
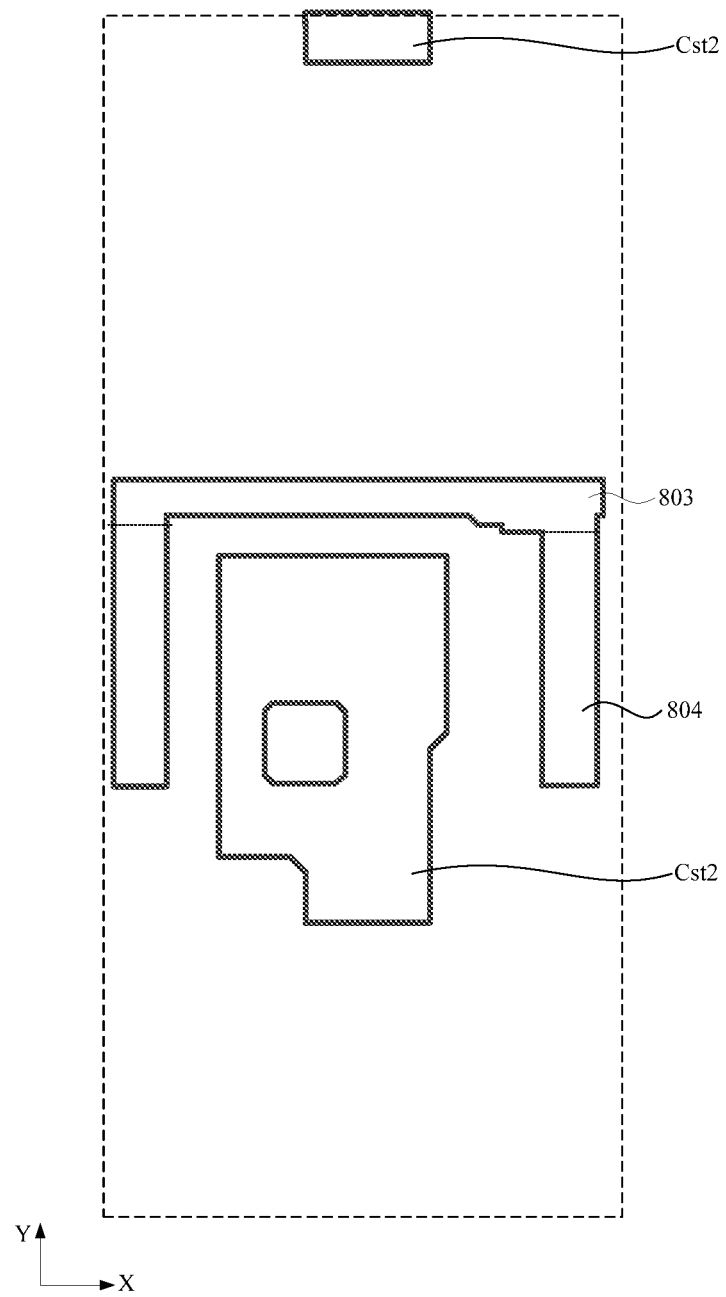
FIG. 7 is a schematic diagram of the layout of the second gate metal layer in FIG. 4.

As shown in FIGS. 4 and 7, in some embodiments, the display panel further includes:

A power signal line layer, the power signal line layer includes a power signal line pattern 901 located in each of the sub-pixel areas, at least part of the power signal line pattern 901 extends along the second direction;

A first shielding layer, the first shielding layer includes first shielding patterns 804 located in the respective sub-pixel areas, the first shielding pattern 804 is coupled to the power signal line pattern 901, and at least part of the first shielding pattern 804 extends along the second direction, and the orthographic projection of the first shielding pattern 804 on the substrate overlaps the orthographic projection of the data line pattern 908 on the substrate.

Specifically, the power signal line layer includes power signal line patterns 901 arranged in the respective sub-pixel areas, the power signal line patterns 901 corresponds to the sub-pixel areas in a one-to-one manner, and the power signal line pattern 901 is located in the corresponding sub-pixel area. At least part of the power signal line pattern 901 extends along the second direction, and the power signal line patterns 901 arranged in each column of sub-pixel areas are sequentially coupled along the second direction to form an integral structure.

The first shielding layer includes a plurality of first shielding patterns 804, and the first shielding patterns 804 corresponds to the sub-pixel areas in a one-to-one manner, and the shielding patterns are located in the corresponding sub-pixel areas. Exemplarily, at least part of the first shielding pattern 804 extends along the second direction, and at least part of the data line pattern 908 extends along the second direction. In a same sub-pixel area, the orthographic projection of the first shielding pattern 804 on the substrate overlaps the orthographic projection of the data line pattern 908 on the substrate; this arrangement enables a larger overlapping area between the first shielding pattern 804 and the data line pattern 908, which makes the shielding effect of the first shielding pattern 804 on the data line pattern 908 more significant.

Exemplarily, the first shielding layer is made of the second gate metal layer in the display panel, that is, the first shielding layer can be formed in the same patterning process as the second electrode plate Cst2 of the storage capacitor Cst.

A signal with a fixed potential is transmitted on the first shielding layer. For example, the first shielding layer is coupled to the power signal line pattern 901 in the display panel, and has a same stable potential as the power signal transmitted on the power signal line.

In the display panel provided by the above-mentioned embodiment, by arranging the first shielding layer with a stable potential to overlap the data line pattern 908, the parasitic capacitance formed between the data line pattern 908 and the gate electrode of the adjacent driving transistor is well shielded, thereby effectively improving the crosstalk phenomenon caused by the change of the data signal in the display panel on the gate electrode of the driving transistor.

As shown in FIGS. 4 and 7, in some embodiments, the display panel further includes: a third auxiliary signal line layer, and the third auxiliary signal line layer includes third auxiliary signal line patterns 803 located in the respective sub-pixel areas. At least part of the third auxiliary signal line pattern 803 extends along the first direction; in the same sub-pixel area, a fourth overlapping area is formed between the orthographic projection of the third auxiliary signal line pattern 803 on the substrate and the orthographic projection of the power signal line pattern 901 on the substrate, and the third auxiliary signal line pattern 803 is coupled to the power signal line pattern 901 in the fourth overlapping area; the third auxiliary signal line patterns 803 in the same row of sub-pixel areas along the first direction are sequentially coupled; in the same sub-pixel area, the first shielding pattern 804 and the third auxiliary signal line pattern 803 are formed as an integral structure.

Specifically, the third auxiliary signal line patterns 803 correspond to the sub-pixel areas in a one-to-one manner, the third auxiliary signal line pattern 803 is located in the corresponding sub-pixel area, and at least part of the third auxiliary signal line pattern 803 extends along the first direction, the third auxiliary signal line patterns 803 located in the same row of sub-pixel areas along the first direction are sequentially coupled. For example, the third auxiliary signal line patterns 803 located in the same row of sub-pixel areas along the first direction are formed as an integral structure.

At least part of the power signal line pattern 901 extends along a second direction, and the second direction intersects the first direction. Therefore, in the same sub-pixel area, the fourth overlapping area is formed between the orthographic projection of third auxiliary signal line pattern 803 on the substrate and the orthographic projection of the power signal line pattern 901 on the substrate, and the third auxiliary signal line pattern 803 is coupled to the power signal line pattern 901 through a third via hole provided in the fourth overlapping area.

In the display panel provided by the foregoing embodiment, the first shielding pattern 804 and the third auxiliary signal line pattern 803 arranged in the same sub-pixel area are formed as an integral structure, which not only enables the first shielding pattern 804 and the third auxiliary signal line pattern 803 to be formed in the same patterning process, but also enables the first shielding pattern 804 to be coupled to the power signal line pattern 901 through the third auxiliary signal line pattern 803, thereby effectively simplifying the manufacturing process of the display panel, and saving the manufacturing cost. In addition, as shown in FIG. 7, it may be further provided that each of the first shielding pattern 804 and the third auxiliary signal line pattern 803 is arranged in the same layer and made of the same material as the second electrode plate Cst2.

In addition, in the display panel provided by the foregoing embodiment, the power signal line patterns 901 located in the same column of sub-pixel areas along the second direction are sequentially coupled, and the third auxiliary signal line patterns 803 located in the same row of sub-pixel areas along the first direction are sequentially coupled, and in the same sub-pixel, the third auxiliary signal line pattern 803 is coupled to the power signal line pattern 901, so that the power signal line layer and the third auxiliary signal line layer are formed together a mesh cross wiring structure, this arrangement effectively improves the stability of the power signal line layer, and the power signal transmitted on the power signal line layer is provided to the source electrode of the driving transistor in the sub-pixel driving circuit, and the light emitting current generated by the sub-pixel driving circuit $I_{oled}=k[(Vgs-Vth)]^2$, Vgs=Vg−Vs, Vg is the gate voltage of the driving transistor, Vs is the source voltage of the driving transistor, and Vth is the threshold voltage of the driving transistor. Therefore, the power signal is Vs, which will affect the value of the light emitting current $I_{oled}$. Therefore, the above setting method improves the stability of the power signal line layer, ensures the stability of the light emitting current $I_{oled}$, and effectively avoids the occurrence of crosstalk phenomenon.

Figure 8:
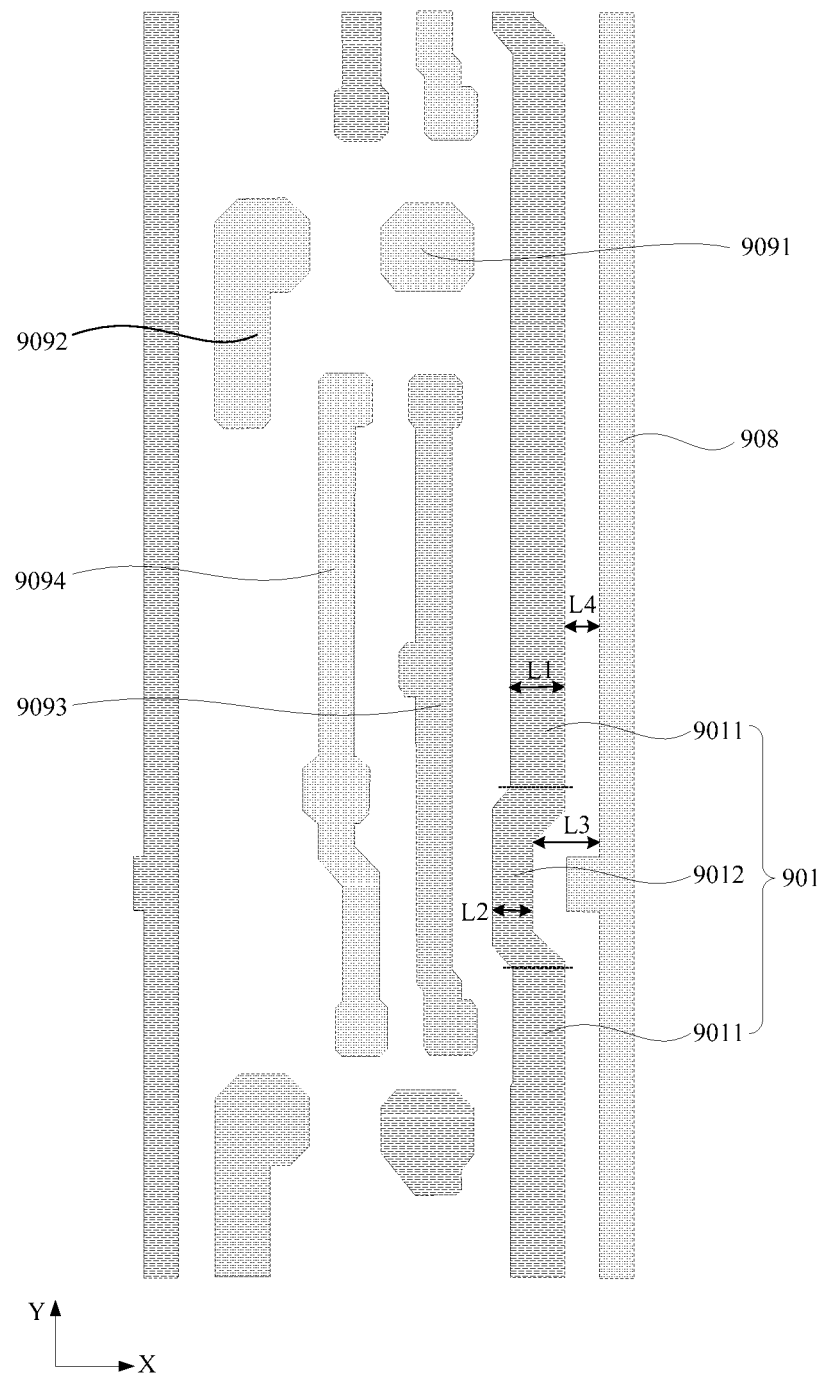
FIG. 8 is a schematic diagram of the layout of the first source-drain metal layer in FIG. 4.

As shown in FIGS. 4 and 8, in some embodiments, the display panel further includes:

A power signal line layer, the power signal line layer includes a power signal line patterns 901 located in each of the sub-pixel areas, at least part of the power signal line pattern 901 extends along the second direction;

In the same sub-pixel area, the orthographic projection of the power signal line pattern 901 on the substrate is located between the orthographic projection of the gate electrode of the driving transistor on the substrate and the orthographic projection of the data line pattern 908 on the substrate.

Specifically, at least part of the power signal line pattern 901 extends along the second direction, and at least part of the data line pattern 908 extends along the second direction. In the same sub-pixel area, the orthographic projection of the power signal line pattern 901 on the substrate is located between the orthographic projection of the gate electrode of the driving transistor on the substrate and the orthographic projection of the data line pattern 908 on the substrate, which enable a longer distance between the data line pattern 908 and the gate electrode of the driving transistor, and enable a good barrier between the power signal line pattern 901 and the data line pattern 908, and the gate electrode of the driving transistor, thereby reducing the lateral parasitic capacitance formed between the data line pattern 908 and the gate electrode of the driving transistor in the same sub-pixel area, effectively improving the stability of the gate potential of the driving transistor.

As shown in FIGS. 4 and 8, in some embodiments, the power signal line pattern 901 includes a first power supply portion 9011 and a second power supply portion 9012 that are coupled to each other, and the first power supply part 9011 extends along the second direction, the second power supply portion 9012 protrudes from the first power supply portion 9011 in a direction away from the data line pattern 908 in the sub-pixel area; in a direction perpendicular to the second direction and parallel to the direction of the substrate, the width L1 of the first power supply portion 9011 is greater than the width L2 of the second power supply portion 9012;

The orthographic projection of the first electrode of the driving transistor (i.e., the first electrode S3 of the third transistor T3) on the substrate overlaps the orthographic projection of the first power supply portion 9011 in the corresponding sub-pixel area on the substrate, and the first electrode of the driving transistor is coupled to the first power supply portion 9011 at the overlapping area.

Specifically, the specific structure of the power supply pattern is various. For example, the power supply signal line pattern 901 includes a first power supply portion 9011 and a second power supply portion 9012 that are coupled to each other. The first power supply portion 9011 extends in the second direction, a first spacing area is formed between the first power supply portion 9011 and the data line pattern 908 in the sub-pixel area where the first power supply portion 9011 is located; the second power supply portion 9012 protrudes from the first power supply portion 9011 from the direction away from the data line pattern 908 in the sub-pixel area where the first power supply portion 9011 is located. A second spacing area is formed between the second power supply portion 9012 and the data line pattern 908, along the direction perpendicular to the second direction, the maximum width L3 of the second spacing area is greater than the maximum width of the first spacing area L4.

The orthographic projection of the first electrode of the driving transistor on the substrate overlaps the orthographic projection of the first power supply portion 9011 in the corresponding sub-pixel area on the substrate, so that the first electrode of the driving transistor is coupled to the first power supply portion 9011 through a connection hole in the overlapping area.

In the above arrangement, in a direction perpendicular to the second direction and parallel to the substrate, the width of the first power supply portion 9011 is greater than the width of the second power supply portion 9012, and the orthographic projection of the first electrode of the driving transistor on the substrate overlaps the orthographic projection of the first power supply portion 9011 in the corresponding sub-pixel area on the substrate, and the first electrode of the driving transistor is coupled to the first power supply portion 9011 through a connection hole in the overlapping area, so that a larger overlapping area can be formed between the orthographic projection of the first electrode of the driving transistor on the substrate and the orthographic projection of the first power supply portion 9011 in the corresponding sub-pixel area on the substrate, a connection hole with larger diameter can be formed at the overlapping area, which is more conducive to coupling performance between the first electrode of the driving transistor and the power signal line pattern 901.

Figure 5:
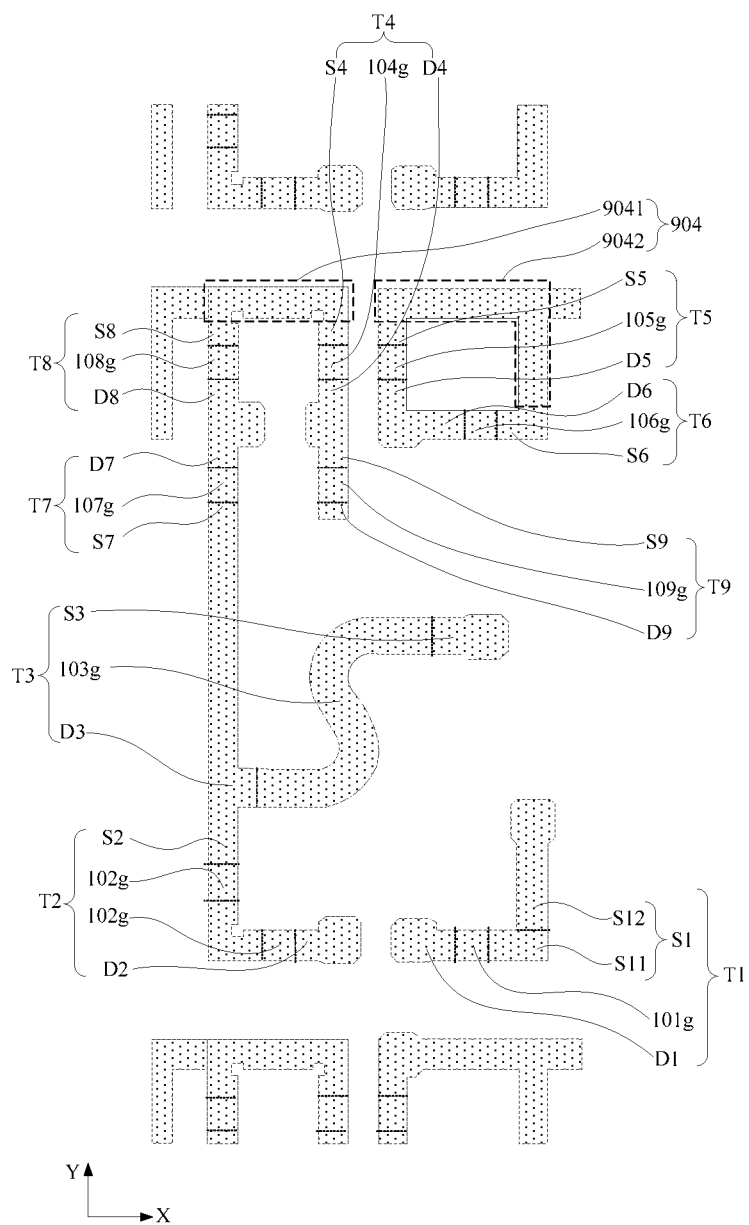
FIG. 5 is a schematic diagram of the layout of an active film layer in FIG. 4.

As shown in FIGS. 4 and 5, in some embodiments, the first electrode S1 of the first transistor T1 includes a first electrode portion S11 and a second electrode portion S12 that are coupled to each other, and the first electrode portion S11 extends in the first direction, the second electrode portion S12 extends in the second direction, the orthographic projection of the second electrode portion S12 on the substrate overlaps the orthographic projection of the data line pattern 908 in the corresponding sub-pixel area on the substrate, and the second electrode portion S12 is coupled to the data line pattern 908 in the corresponding sub-pixel area through the first connection hole 64 at the overlapping area; the orthographic projection of the first connection hole 64 on the substrate and the orthographic projection of the second power supply portion 9012 on the substrate are arranged in a direction perpendicular to the second direction.

Specifically, the specific structure of the first electrode Si of the first transistor T1 is various. For example, the first electrode S1 of the first transistor T1 includes a first electrode portion S11 and a second electrode portion S12 that are coupled to each other. The first electrode portion S11 extends along the first direction, and the second electrode portion S12 extends along the second direction.

As described above, the orthographic projection of the first connecting hole 64 on the substrate and the orthographic projection of the second power supply portion 9012 on the substrate are arranged in a direction perpendicular to the second direction, so that the first connection hole 64 can be formed in the vicinity of the second spacing area, and since the distance between the second power supply portion 9012 and the data line pattern 908 in the second spacing area is longer, which is more conducive to increase the diameter of the first connection hole, and effectively improves the coupling performance between the second electrode portion S12 and the data line pattern 908.

As shown in FIGS. 4 and 5, in some embodiments, the orthographic projection of the first electrode portion S11 on the substrate overlaps the orthographic projection of the first power supply portion 9011 in the corresponding sub-pixel area on the substrate; and/or, The orthographic projection of a channel area 101g of the first transistor T1 on the substrate overlaps the orthographic projection of the first power supply portion 9011 in the corresponding sub-pixel area on the substrate.

The above arrangement enables the power signal line pattern 901 to shield the static crosstalk generated by the data line pattern 908 on the first electrode portion S11 and the channel area 101g of the first transistor T1, thereby improving the stability of the display panel.

Figure 9:
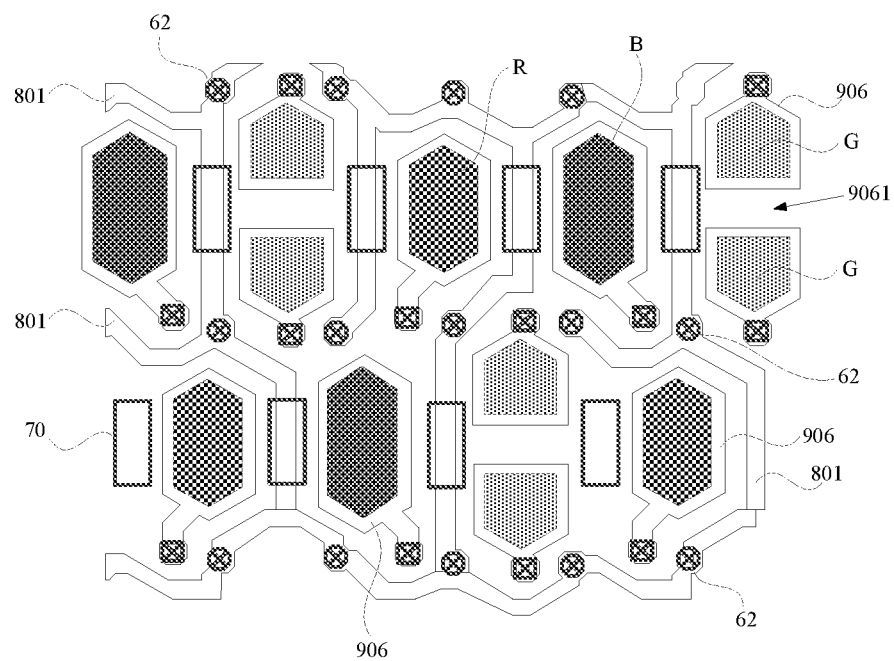
FIG. 9 is a schematic diagram of the layout of the first auxiliary signal line layer provided by an embodiment of the disclosure.

As shown in FIGS. 4, 5, and 9, in some embodiments, the display panel further includes:

An initialization signal line layer, the initialization signal line layer includes initialization signal line patterns 904 arranged in the sub-pixel areas;

An anode layer located on a side of the initialization signal line layer away from the substrate, the anode layer includes a plurality of anode patterns 906 corresponding to the plurality of sub-pixel areas in a one-to-one manner, and the plurality of anode patterns 906 are arranged at intervals, an anode spacing area 9061 is formed between adjacent anode patterns 906;

A first auxiliary signal line layer 801, the first auxiliary signal line layer 801 has a grid structure. At least a part of the first auxiliary signal line layer 801 is located in the anode spacing area 9061 and is insulated from the anode pattern 906. The initialization signal line pattern 904 in each of the sub-pixel areas is respectively coupled to the first auxiliary signal line layer 801.

Specifically, the initialization signal line layer includes a plurality of initialization signal line patterns 904, the plurality of initialization signal line patterns 904 correspond to the plurality of sub-pixel areas in a one-to-one manner, and the initialization signal line pattern 904 is located in the corresponding sub-pixel area and used to provide an initialization signal for the sub-pixel driving circuit corresponding to the sub-pixel area.

The anode layer is located on the side of the sub-pixel driving circuit in the display panel away from the substrate. The anode layer includes a plurality of anode patterns 906, and the plurality of anode patterns 906 are spaced apart from each other. An anode spacing area 9061 is formed between adjacent anode patterns 906. The anode pattern 906 corresponds to the sub-pixel driving circuit in the display panel in a one-to-one manner, and the anode pattern 906 is coupled to the corresponding sub-pixel driving circuit and can receive the driving signal provided by the corresponding sub-pixel driving circuit. A light emitting function layer and a cathode layer are arranged at the side of the anode layer away from the substrate. The light emitting function layer is located between the anode layer and the cathode layer and can emit light of the corresponding color under the action of the electric field formed between the anode layer and the cathode layer. It is worth noting that the light emitting functional layer may specifically include a hole injection layer, a hole transport layer, an organic light emitting material layer, an electron transport layer, and an electron injection layer stacked on each other, but it is not limited thereto. As shown in FIG. 9, a red light emitting element R, a green light emitting element G, and a blue light emitting element B are shown. The light emitting elements of different colors correspond to the organic light emitting material layers of different colors.

As shown in FIG. 9, the display panel further includes a first auxiliary signal line layer 801, at least part of the first auxiliary signal line layer 801 is arranged in the anode spacing area 9061 and insulated from the anode pattern 906. The anode spacing area 9061 is formed as a grid area, so that the first auxiliary signal line layer 801 arranged on the anode spacing area 9061 is formed as a grid structure. Exemplarily, the first auxiliary signal line layer 801 may be laid out in all the anode spacing areas 9061 in the display panel.

Figure 10:
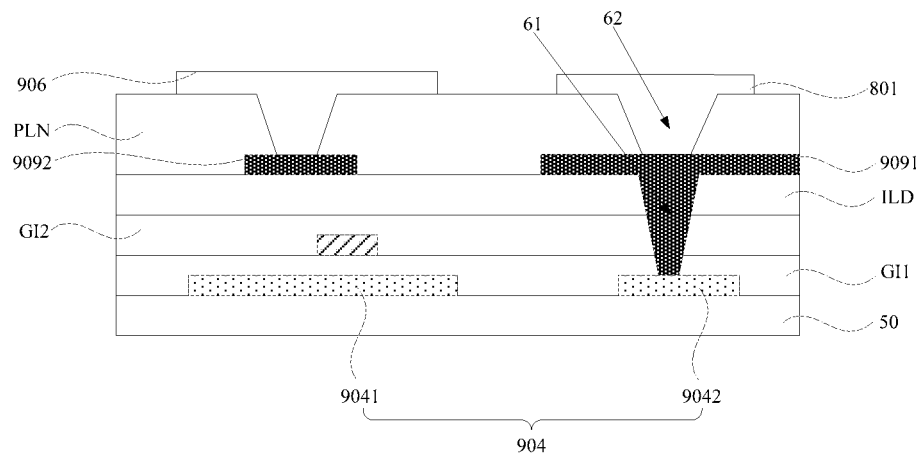
FIG. 10 is a schematic cross-sectional view taken along the direction B1-B2 in FIG. 4.

It is worth noting that, as shown in FIG. 10, the display panel further includes a planarization layer PLN. The anode layer (including the anode pattern 906) is generally formed on the surface of the planarization layer PLN away from the substrate 50, and the first auxiliary signal line layer 801 is laid out in the anode spacing area 9061, so that the first auxiliary signal line layer 801 is also laid out on the surface of the planarization layer PLN away from the substrate 50. In this layout, the first auxiliary signal line layer 801 is arranged in the same layer as the anode layer to avoid the increase in the thickness of the display panel due to the introduction of the first auxiliary signal line layer 801.

The first auxiliary signal line layer 801 is laid out in the anode spacing area 9061, so that the first auxiliary signal line layer 801 is located on the side of the initialization signal line pattern 904 away from the substrate 50, for example, a via hole can be provided between the first auxiliary signal line layer 801 and the initialization signal line pattern 904, so that the first auxiliary signal line layer 801 is coupled to the initialization signal line pattern 904 through the via hole.

The display panel provided by the foregoing embodiment includes an initialization signal line pattern 904 located in each sub-pixel area, and the first auxiliary signal line layer 801 located in the anode spacing area 9061 and having a grid structure. The initialization signal line patterns 904 in each sub-pixel area is coupled to the first auxiliary signal line layer 801, so that the first auxiliary signal line layer 801 connects all the initialization signal line patterns 904 in the sub-pixel areas together. It is realized that the first auxiliary signal line layer 801 can provide the initialization signal for the initialization signal line pattern 904 in each sub-pixel area; therefore, in the display panel provided by the above-mentioned disclosed embodiment, the initialization signal line pattern 904 in each sub-pixel area is respectively coupled to the first auxiliary signal line layer 801 arranged in the anode spacing area 9061, which solves the problem that the initialization signal line patterns 904 in the same row are not easily connected due to the limited layout space of the display panel.

Moreover, in the display panel provided by the above-mentioned embodiment, the first auxiliary signal line layer 801 can be laid out in all the anode spacing areas 9061 in the display area, and the initialization signal line pattern 904 in each sub-pixel area is coupled to the first auxiliary signal line layer 801, so as to ensure the stability of the initialization signal transmitted on the initialization signal line pattern 904 in each sub-pixel area. In addition, the first auxiliary cathode layer is laid out in the anode spacing area 9061, so that the first auxiliary signal line layer 801 and the anode layer are arranged in the same layer, which is more conducive to the thinning of the display panel.

It should be noted that the initialization signal line pattern 904 provided in the foregoing embodiment is used to provide an initialization signal (Vinit) for the corresponding sub-pixel driving circuit, and used to provide a reference signal (Vref) for the corresponding sub-pixel driving circuit.

As shown in FIG. 5, in some embodiments, the initialization signal line pattern 904 and the active layer in the driving transistor are arranged at the same layer and made of the same material.

Specifically, the initialization signal line pattern 904 and the active layer in the driving transistor are arranged at the same layer and made of the same material, the initialization signal line pattern 904 and the active layer are formed in the same patterning process. Since the first electrode (or the second electrode) of the transistor structure coupled to the initialization signal line pattern 904 in the display panel is also made of the active layer, the first electrode (or the second electrode) and the initialization signal line pattern 904 coupled to the first electrode (or the second electrode) form an integral structure, thereby further saving the layout space occupied by the transistor structure and the initialization signal line pattern 904, which is more conducive to improving the resolution of the display panel.

As shown in FIGS. 4, 8 and 10, in some embodiments, the conductive connection portion layer further includes a first conductive connection portion 9091 arranged in each of the sub-pixel areas; in the same sub-pixel area, a first overlapping area is formed between the orthographic projection of the first conductive connecting portion 9091 on the substrate 50 and the orthographic projection of the initialization signal line pattern 904 (the first sub-pattern 9041 in FIG. 10) on the substrate 50, a second overlapping area is formed between the orthographic projection of the first conductive connection portion 9091 on the substrate 50 and the first auxiliary signal line layer 801; the first conductive connection portion 9091 is coupled to the initialization signal line pattern 904 in the first overlapping area, and the first conductive connection portion 9091 is coupled to the first auxiliary signal line layer 801 in the second overlapping area.

Specifically, the conductive connection portion layer can be made of the first source-drain metal layer in the display panel, and the specific structure of the first conductive connection portion 9091 included in the conductive connection portion layer can be set according to actual needs, as long as the first overlapping area is formed between the orthographic projection of the first conductive connection portion 9091 on the substrate 50 and the orthographic projection of the initialization signal line pattern 904 on the substrate 50, and a second overlapping area is formed between the orthographic projection of the first conductive connection portion 9091 on the substrate 50 and the first auxiliary signal line layer 801.

As shown in FIGS. 4 and 10, exemplarily, the first conductive connection portion 9091 is coupled to the initialization signal line pattern 904 through a first via hole 61 located in the first overlapping area, and the first conductive connection portion 9091 is coupled to the first auxiliary signal line layer 801 through a second via hole 62 located in the second overlapping area. It should be noted that FIG. 10 also shows the second conductive connection portion 9092, the first gate insulating layer GI1, the second gate insulating layer GI2, the interlayer insulating layer ILD, and the planarization layer PLN.

In the display panel provided by the above-mentioned embodiment, the first conductive connection portion 9091 is provided to realize the coupling between the initialization signal line pattern 904 and the first auxiliary signal line layer 801, which avoids a deep via hole from forming between the initialization signal line pattern 904 and the first auxiliary signal line layer 801, which greatly improves the coupling reliability between the initialization signal line pattern 904 and the first auxiliary signal line layer 801, and in this arrangement, the initialization signal line pattern 904 and the first auxiliary signal line layer 801 have more layout methods, which better reduces the difficulty of layout and manufacturing process of the display panel.

As shown in FIGS. 4 and 5, in some embodiments, each initialization signal line pattern 904 includes a first sub-pattern 9041 and a second sub-pattern 9042, and in adjacent sub-pixel areas located in the same row along the first direction, the second sub-pattern 9042 in the previous sub-pixel area and the first sub-pattern 9041 in the current sub-pixel area form an integral structure; the second sub-pattern 9042 is coupled to the first auxiliary signal line layer 801 in each sub-pixel area.

Specifically, the specific structures of the initialization signal line patterns 904 are various. For example, each initialization signal line pattern 904 includes a first sub-pattern 9041 and a second sub-pattern 9042, the first sub-pattern 9041 and the second sub-pattern 9042 are arranged along the first direction in the same sub-pixel area. When the initialization signal line pattern 904 is arranged by this structure, among adjacent sub-pixel areas, the second sub-pattern 9042 in the previous sub-pixel area is adjacent to the first sub-pattern 9041 in the current sub-pixel area.

In the above arrangement, in adjacent sub-pixel areas in the same row along the first direction, the second sub-pattern 9042 in the previous sub-pixel area and the first sub-pattern 9041 in the current sub-pixel area form an integral structure, which is not only conducive to improve the stability of the initialization signal transmitted on the initialization signal line pattern 904 and can effectively reduce the difficulty of making the initialization signal line pattern 904.

It is worth noting that when the initialization signal line pattern 904 includes the first sub-pattern 9041 and the second sub-pattern 9042, for example, the first sub-pattern 9041 and the second sub-pattern 9042 are respectively coupled to the first auxiliary signal line layer 801. This connection mode can better ensure the connection performance between the initialization signal line pattern 904 and the first auxiliary signal line layer 801, and can more effectively improve the stability of the initialization signal transmitted by the initialization signal line pattern 904; or, as shown in FIG. 4, in each sub-pixel area, the second sub-pattern 9042 is coupled to the first auxiliary signal line layer 801, namely as shown in FIG. 10, the first conductive connection portion 9091 is coupled to the second sub-pattern 9042 through a first via hole 61 located in the first overlapping area, and the first conductive connection portion 9091 is coupled to the first auxiliary signal line layer 801 through a second via hole 62 located in the second overlapping area.

As shown in FIG. 9, in some embodiments, the first auxiliary signal line layer 801 and the anode layer are arranged at the same layer and made of the same material.

Specifically, the first auxiliary signal line layer 801 and the anode layer are arranged in the same layer and made of the same material, so that the first auxiliary signal line layer 801 and the anode layer can be formed in the same patterning process without requiring an additional patterning process for the first auxiliary cathode layer, thereby effectively simplifying the production process and saving production costs.

It is worth noting that when the first auxiliary signal line layer 801 and the anode layer are arranged in the same layer and made of the same material, a certain distance needs to be reserved between the first auxiliary signal line layer 801 and the anode layer, so as to avoid short-circuit between the first auxiliary signal line layer 801 and the anode layer, avoid affecting the yield of the display panel.

Figure 6:
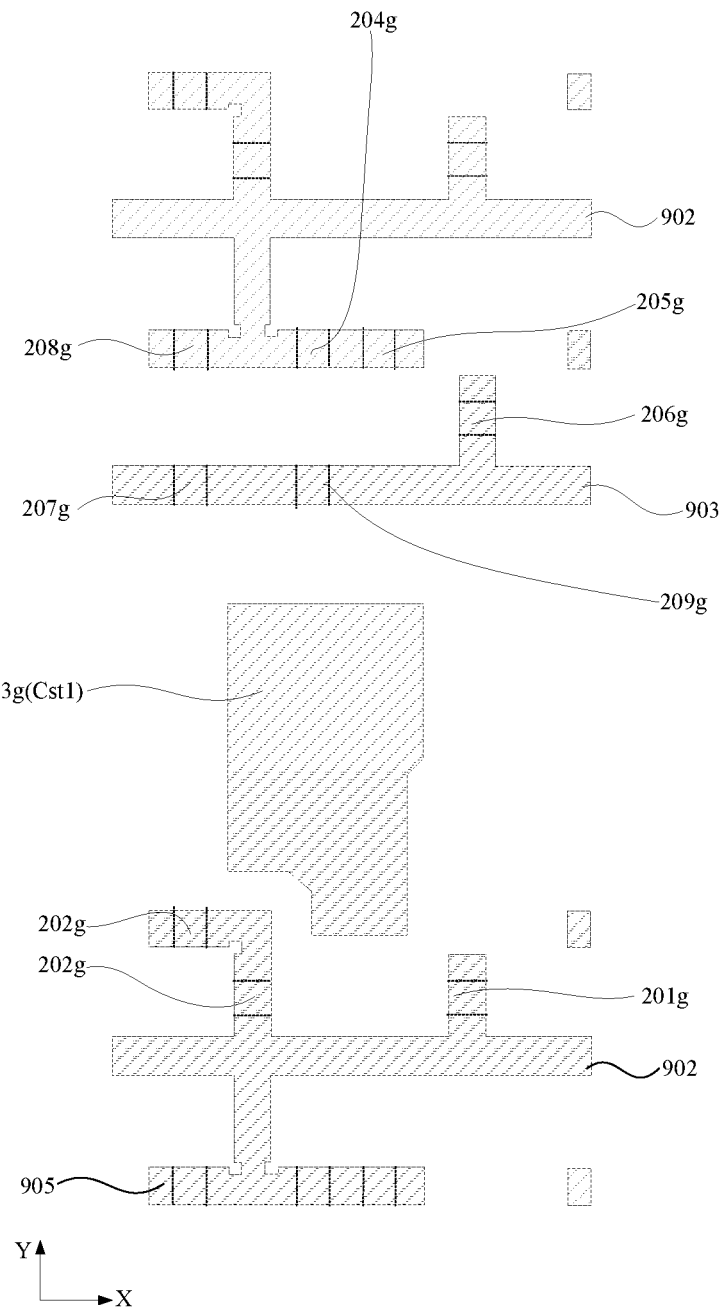
FIG. 6 is a schematic diagram of the layout of the first gate metal layer in FIG. 4.

As shown in FIGS. 4 and 6, in some embodiments, the display panel further includes:

A reset signal line layer, the reset signal line layer includes a reset signal line pattern 905 located in each of the sub-pixel areas, and the gate line pattern 902 in the current sub-pixel area and the reset signal line pattern 905 in an adjacent next sub-pixel area along the second direction are formed as an integral structure.

Specifically, at least part of each of the gate line patterns 902 extends along the first direction, and the gate line patterns 902 in the sub-pixel areas located in the same row along the first direction are electrically connected in sequence to form an integral structure. Each reset signal line pattern 905 extends along the first direction, the gate line pattern 902 in the current sub-pixel area and the reset signal line pattern 905 in the adjacent next sub-pixel area along the second direction may be formed as an integral structure by a connecting portion extending along the second direction.

The gate line pattern 902, the reset signal line pattern 905, and the light emitting control signal line pattern 903 included in the display panel can all be made of a first gate metal layer, so that the gate line pattern 902, the reset signal line pattern 905 and the light emitting control signal line pattern 903 can be formed in the same patterning process, thereby effectively simplifying the manufacturing process and saving production costs.

The gate line pattern 902 in the current sub-pixel area and the reset signal line pattern 905 in the adjacent next sub-pixel area along the second direction are formed as an integral structure, so that the scan signal transmitted on the gate line pattern 902 in the sub-pixel area in the previous row can be used as the reset signal transmitted on the reset signal line pattern 905 in sub-pixels in the next row, thereby avoiding the introduction of a special signal transmission path due to a reset signal provided for the reset signal line pattern 905, and effectively reducing the layout space occupied by the reset signal line pattern 905, improving the resolution of the display panel. The above layout method can support a display panel with a pixel resolution of 400 PPI.

In some embodiments, the display panel further includes: a power signal line pattern, an initialization signal line pattern, a reset signal line pattern, and a light emitting control signal line pattern located in each of the sub-pixel areas; each of the sub-pixel driving circuits further includes: a fourth transistor, a fifth transistor, a sixth transistor, a seventh transistor, an eighth transistor, and a ninth transistor;

The first electrode of the first transistor is coupled to a corresponding data line pattern;

The first electrode of the second transistor is coupled to the second electrode of the driving transistor;

The first electrode of the driving transistor is coupled to the corresponding power signal line pattern;

The gate electrode of the fourth transistor is coupled to the corresponding reset signal line pattern, the first electrode of the fourth transistor is coupled to the corresponding initialization signal line pattern, and the second electrode of the fourth transistor is coupled to the gate electrode of the driving transistor;

The gate electrode of the fifth transistor is coupled to the corresponding reset signal line pattern, the first electrode of the fifth transistor is coupled to the corresponding initialization signal line pattern, and the second electrode of the fifth transistor is coupled to the second electrode plate of the storage capacitor;

The gate electrode of the sixth transistor is coupled to the corresponding light emitting control signal line pattern, the first electrode of the sixth transistor is coupled to the corresponding initialization signal line pattern, and the second electrode of the sixth transistor is coupled to the second electrode plate of the storage capacitor;

The gate electrode of the seventh transistor is coupled to the corresponding light emitting control signal line pattern, the first electrode of the seventh transistor is coupled to the second electrode of the driving transistor, and the second electrode of the seventh transistor is coupled to the corresponding anode pattern;

The gate electrode of the eighth transistor is coupled to the corresponding reset signal line pattern, the first electrode of the eighth transistor is coupled to the corresponding initialization signal line pattern, and the second electrode of the eighth transistor is coupled to the corresponding anode pattern;

The gate electrode of the ninth transistor is coupled to the corresponding light emitting control signal line pattern, the first electrode of the ninth transistor is coupled to the gate electrode of the third transistor, and the second electrode of the ninth transistor is floating.

Specifically, as shown in FIGS. 2 and 4, the gate electrode 201*g* of the first transistor T1 is coupled to the gate line pattern 902, and the first electrode S1 of the first transistor T1 is coupled to the data line pattern 908, the second electrode D1 of the first transistor T1 is coupled to the second electrode plate Cst2 of the storage capacitor Cst, and the first electrode plate Cst1 of the storage capacitor Cst is coupled to the gate electrode 203*g* of the third transistor T3 (that is, the driving transistor);

The gate electrode 202*g* of the second transistor T2 is coupled to the gate line pattern 902, the first electrode S2 of the second transistor T2 is coupled to the second electrode D3 of the third transistor T3, and the second electrode D2 of the second transistor T2 is coupled to the gate electrode 203*g* of the third transistor T3;

The first electrode S3 of the third transistor T3 is coupled to the power signal line pattern 901;

The gate electrode 204*g* of the fourth transistor T4 is coupled to the reset signal line pattern 905, the first electrode S4 of the fourth transistor T4 is coupled to the initialization signal line pattern 904, and the second electrode D4 of the fourth transistor T4 is coupled to the gate electrode 203g of the third transistor T3;

The gate electrode 205g of the fifth transistor T5 is coupled to the reset signal line pattern 905, the first electrode S5 of the fifth transistor T5 is coupled to the initialization signal line pattern 904, and the second electrode D5 of the fifth transistor T5 is coupled to the second electrode plate Cst2 of the storage capacitor Cst;

The gate electrode 206g of the sixth transistor T6 is coupled to the light emitting control signal line pattern 903, the first electrode S6 of the sixth transistor T6 is coupled to the initialization signal line pattern 904, and the second electrode D6 of the sixth transistor T6 is coupled to the second electrode plate Cst2 of the storage capacitor Cst;

The gate electrode 207g of the seventh transistor T7 is coupled to the light emitting control signal line pattern 903, the first electrode S7 of the seventh transistor T7 is coupled to the second electrode D3 of the third transistor T3, and the second electrode D7 of the seventh transistor T7 is coupled to the anode pattern 906 of the corresponding light emitting element EL, and the cathode of the light emitting element EL is coupled to the negative power signal line VSS;

The gate electrode 208g of the eighth transistor T8 is coupled to the reset signal line pattern 905, the first electrode S8 of the eighth transistor T8 is coupled to the initialization signal line pattern 904, and the second electrode D8 of the eighth transistor T8 is coupled to the anode pattern 906 of the corresponding light emitting element EL.

At least part of the power signal line pattern 901 and the data line pattern 908 extend in the second direction; at least part of the gate line pattern 902, the light emitting control signal line pattern 903, and the reset signal line pattern 905 all extend in a first direction, the first direction intersects the second direction. Exemplarily, the first direction includes the X direction, and the second direction includes the Y direction.

The plurality of sub-pixel areas can be divided into multiple rows of sub-pixel areas sequentially arranged along the second direction, and multiple columns of sub-pixel areas sequentially arranged along the first direction. The gate line patterns 902 located in the sub-pixel areas in the same row are electrically connected in sequence to form an integral structure; the light emitting control signal line patterns 903 located in sub-pixel areas in the same column are electrically connected in sequence to form an integral structure; the data line patterns 908 located in sub-pixel areas in the same column are electrically connected in sequence to form an integral structure; the power signal line patterns 901 located in the sub-pixel area in the same column are electrically connected in sequence to form an integral structure.

The layout of film layers in the display panel is as follows: a buffer layer, a sub-pixel driving circuit film layer, an anode layer, a pixel defining layer, and a spacing layer 70 that are sequentially stacked on the substrate in a direction away from the substrate. The layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer that are stacked in sequence in a direction away from the substrate.

As shown in FIG. 8, the active film layer is used to form the channel areas (such as 101g-109g), first electrodes (such as S1-S9) and second electrodes (such as D1-D9) of transistors in the sub-pixel driving circuit, due to the doping effect, the conductivity of the active film layer corresponding to the first electrode and the second electrode will be better than that of the active film layer corresponding to the channel area; the active film layer can be amorphous silicon or polysilicon, oxide semiconductor materials, etc. It should be noted that the first electrode and the second electrode may be doped with n-type impurities or p-type impurities. In addition, it is worth noting that the active film layers corresponding to the first electrode and the second electrode can be directly used as the source electrode or the drain electrode of the corresponding transistor, or a metal material can also be used to make the source electrode in contact with the first electrode, and the drain electrode in contact with the second electrode.

The active film layer is also used to form the initialization signal line pattern 904, and due to the doping effect, the part of the active film layer used to form the initialization signal line pattern 904 can have good conductivity.

The first gate metal layer is used to form the gate electrodes of the transistors in the sub-pixel driving circuit (such as 201g-209g), and the gate line pattern 902, the light emitting control signal line pattern 903, and the reset signal line pattern 905 included in the display panel. The gate electrode 203g of the third transistor T3 in each sub-pixel driving circuit is multiplexed as the first electrode plate Cst1 of the storage capacitor Cst in the sub-pixel driving circuit.

The second gate metal layer is used to form the second electrode plate Cst2 of the storage capacitor Cst, and the second auxiliary signal line layer and the third auxiliary signal line layer included in the display panel.

The first source-drain metal layer is used to form the data line pattern 908, the power signal line pattern 901 and some conductive connection portions.

Figure 3:
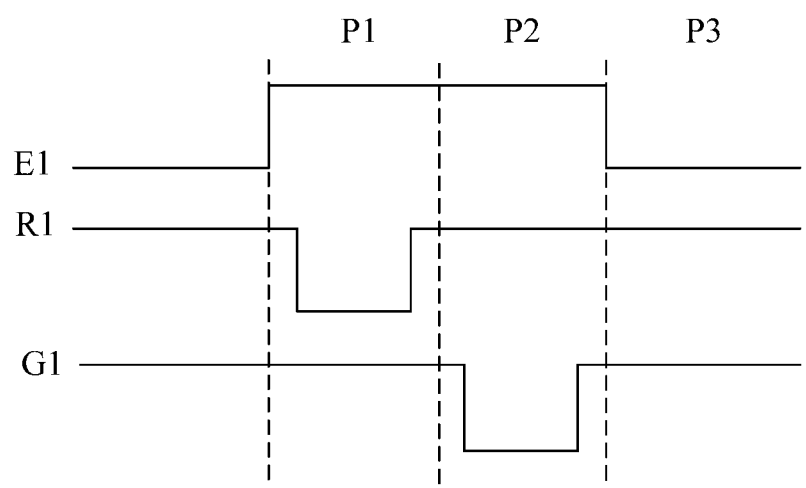
FIG. 3 is a working timing diagram of a sub-pixel driving circuit provided by an embodiment of the disclosure.

As shown in FIG. 2 and FIG. 3, when the sub-pixel driving circuit of the above structure is in operation, each work cycle includes a reset period P1, a writing-in compensation period P2, and a light emitting period P3. In FIG. 3, E1 represents the light emitting control signal transmitted on the light emitting control signal line pattern 903 in the current sub-pixel area, R1 represents the reset signal transmitted on the reset signal line pattern 905 in the current sub-pixel area, and G1 represents the gate scan signal transmitted on the gate line pattern 902 in the current sub-pixel area.

In the reset period P1, the reset signal inputted by the reset signal line pattern 905 is at a valid level, the fourth transistor T4, the fifth transistor T5, and the eighth transistor T8 are turned on, the initialization signal transmitted by the initialization signal line pattern 904 is inputted to the gate electrode 203g of the third transistor T3, the anode pattern 906 and the second electrode plate of the storage capacitor, so that the gate-source voltage Vgs maintained on the third transistor T3 in the previous frame is cleared, and the gate electrode 203g of the third transistor T3 is reset, and the anode pattern 906 and the second electrode plate of the storage capacitor are reset at the same time.

In the writing-in compensation period P2, the reset signal inputted by the reset signal line pattern 905 is at an invalid level, the fourth transistor T4, the fifth transistor T5, and the eighth transistor T8 are all turned off, and the scan signal inputted by the gate line pattern 902 is at a valid level, the first transistor T1 and the second transistor T2 are controlled to be turned on, the data signal is written in the data line pattern 908, and is transmitted to the node N1 through the first transistor T1, and is coupled to the gate electrode of the third transistor T3 through the storage capacitor. At the same time, the first transistor T1 and the second transistor T2 are turned on, so that the third transistor T3 is formed into a diode structure. Therefore, the first transistor T1, the third transistor T3, and the second transistor T2 work together to achieve the threshold voltage compensation of the third transistor T3, when the compensation time is long enough, the potential of the gate electrode 203g of the third transistor T3 can be controlled to finally reach Vth+VDD, VDD is the power signal voltage value, and Vth represents the threshold voltage of the third transistor T3.

In the light emitting period P3, the light emitting control signal written by the light emitting control signal line pattern 903 is at a valid level, and the sixth transistor T6 and the seventh transistor T7 are controlled to be turned on, and the power signal transmitted by the power signal line pattern 901 is inputted to the source electrode of the third transistor. At the same time, due to the coupling effect of the storage capacitor, the potential of the gate electrode 203g of the third transistor T3 becomes Vint−Vdata+Vth+VDD, where Vdata represents the voltage value of the data signal, and Vint represents the voltage value of the initial signal, so that the third transistor T3 is turned on, the gate-source voltage of the third transistor T3 is Vdata−Vint+Vth, and the leakage current generated based on the gate-source voltage flows to the anode pattern 906 of the corresponding light emitting element EL to drive the corresponding light emitting element EL to emit light.

In some embodiments, the sub-pixel driving circuit further includes a ninth transistor T9, the gate electrode 209g of the ninth transistor T9 is coupled to the light emitting control signal line pattern 903, and the first electrode S9 of the ninth transistor T9 is coupled to the gate electrode 203g of the third transistor T3, and the second electrode D9 of the ninth transistor T9 is floating.

Specifically, in the reset period P1 and in the writing-in compensation period P2, the light emitting control signal written by the light emitting control signal line pattern 903 is at an invalid level, and the ninth transistor T9 is controlled to be turned off. In the light emitting period P3, the light emitting control signal written by the light emitting control signal line pattern 903 is at a valid level, and the ninth transistor T9 is controlled to be turned on.

The aforementioned sub-pixel driving circuit further includes the ninth transistor T9, so that during the light emitting period, by turning on the ninth transistor T9, the excess charge accumulated in the gate electrode 203g of the third transistor T3 can be discharged to ensure the stable potential of the gate electrode 203g of the third transistor T3.

It should be noted that when it is from the writing-in compensation period P2 to the light emitting period P3, the potential of the scan signal inputted by the gate line pattern 902 increase, thereby pulling the potential of the gate electrode 203g of the third transistor T3, so that excess charge are accumulated at the gate electrode 203g of the third transistor T3.

The embodiments of the present disclosure also provide a display device, including the display panel provided in the above-mentioned embodiments.

Because in the display panel provided by the foregoing embodiment, the orthographic projection of the data line pattern 908 on the substrate overlaps the orthographic projection of the gate line pattern 902 on the substrate, and the orthographic projection of the gate line pattern 902 on the substrate does not overlap the orthographic projection of the third conductive connecting portion 9093 on the substrate, and/or the orthographic projection of the gate line pattern 902 on the substrate does not overlap the orthographic projections of the four conductive connecting portions 9094 on the substrate; so that in the same sub-pixel area, in the direction perpendicular to the substrate, the gate line pattern 902 can only overlap the data line pattern 908, do not overlap the third conductive connection portion 9093 and/or the fourth conductive connection portion 9094, thereby preventing from forming series parasitic electricity between the data line pattern 908 and the third conductive connection portion 9093 and/or the fourth conductive connecting portion 9094 through the gate line pattern 902, which effectively improves the crosstalk problem of the change of the gate voltage of the driving transistor caused by the jump of the data signal transmitted on the data line pattern 908.

Therefore, in the display panel provided by the foregoing embodiment, when the display panel is in the light emitting state, even if the voltage jump of the data signal transmitted on the data line pattern 908 occurs, the change of the gate voltage of the driving transistor will not be driven by the parasitic capacitance, thereby ensuring the stability of the gate voltage of the driving transistor, and effectively improving the display quality of the display panel.

Therefore, when the display device provided by the embodiment of the present disclosure includes the display panel provided by the above-mentioned embodiment, it also has the above-mentioned beneficial effects, which will not be repeated here.

It should be noted that the display device may be any product or component with a display function, such as a TV, a monitor, a digital photo frame, a mobile phone, a tablet computer, and the like.

The embodiments of the present disclosure also provide a method for manufacturing a display panel, which is used to manufacture the display panel provided in the above-mentioned embodiments, the display panel including a plurality of sub-pixel areas arranged in an array; the manufacturing method includes:

Forming a sub-pixel driving circuit film layer, a gate line layer, a data line layer and a conductive connection layer on a substrate;

The gate line layer includes a gate line pattern 902 located in each of the sub-pixel areas, and at least part of the gate line pattern 902 extends along a first direction;

The data line layer includes a data line pattern 908 located in each of the sub-pixel areas, at least part of the data line pattern 908 extends along a second direction, the first direction intersects the second direction, and the orthographic projection of the data line pattern 908 on the substrate overlaps the orthographic projection of the gate line pattern 902 on the substrate;

The conductive connection portion layer includes a third conductive connection portion 9093 and a fourth conductive connection portion 9094 located in each of the sub-pixel areas;

The sub-pixel driving circuit film layer includes sub-pixel driving circuits corresponding to the sub-pixel areas in a one-to-one manner, and each of the sub-pixel driving circuits includes: a driving transistor (that is, a third transistor T3), a storage capacitor Cst, and a first transistor T1 and a second transistor T2; the gate electrode of the driving transistor is multiplexed as the first plate Cst1 of the storage capacitor Cst, and the gate electrode of the driving transistor is coupled to the second electrode D2 of the second transistor T2 through the fourth conductive connection portion 9094 in the corresponding sub-pixel area, and the second electrode plate Cst2 of the storage capacitor Cst is coupled to the second electrode D1 of the first transistor T1 through the third conductive connection portion 9093 in the corresponding sub-pixel area. The gate electrode 201g of the first transistor T1 and the gate electrode 202g of the second transistor T2 are respectively coupled to the gate line pattern 902 in the corresponding sub-pixel area; the orthographic projection of the gate line pattern 902 on the substrate does not overlap the orthographic projection of the third conductive connecting portion 9093 on the substrate, and/or the orthographic projection of the gate line pattern 902 on the substrate does not overlap the orthographic projection of the fourth conductive connection portion 9094 on the substrate.

In the display panel manufactured by the manufacturing method provided by the embodiment of the present disclosure, the orthographic projection of the data line pattern 908 on the substrate overlaps the orthographic projection of the gate line pattern 902 on the substrate, and the orthographic projection of the gate line pattern 902 on the substrate does not overlap the orthographic projection of the third conductive connecting portion 9093 on the substrate, and/or the orthographic projection of the grid line pattern 902 on the substrate does not overlaps the orthographic projection of the fourth conductive connecting portion 9094 on the substrate, in the same sub-pixel area, in the direction perpendicular to the substrate, the gate line pattern 902 can only overlap the data line pattern 908, but does not overlap the third conductive connection portion 9093 and/or the fourth conductive connection portion 9094, thereby preventing a series parasitic electricity formed by the data line pattern 908 and the third conductive connection portion 9093 and/or the fourth conductive connection portion 9094 through the gate line pattern 902, which effectively improves the cross-talk problem of the gate voltage change of the driving transistor caused by the jump of the data signal transmitted on the data line pattern 908.

Therefore, in the display panel manufactured by the manufacturing method provided by the embodiment of the present disclosure, when the display panel is in the light emitting state, even if the jump of the voltage of the data signal transmitted on the data line pattern 908 occurs, the change of the gate voltage of the driving transistor driven by the parasitic capacitance will not occur, thereby ensuring the stability of the gate voltage of the driving transistor, and effectively improving the display quality of the display panel.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant part can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising: a substrate and a sub-pixel driving circuit film layer, a gate line layer, a data line layer, and a conductive connection portion layer disposed on the substrate, and a plurality of sub-pixel areas arranged in an array; wherein the gate line layer includes a gate line pattern located in each of the plurality of sub-pixel areas, and at least part of the gate line pattern extends along a first direction;

the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate;

the conductive connection portion layer includes a third conductive connection portion and a fourth conductive connection portion located in each of the plurality of sub-pixel areas;

the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate;

the display panel further comprises:

a power signal line layer, wherein the power signal line layer includes a power signal line pattern located in each of the plurality of the sub-pixel areas, at least part of the power signal line pattern extends along the second direction;

a first shielding layer, wherein the first shielding layer includes a first shielding pattern located in each of the plurality of sub-pixel areas, the first shielding pattern is coupled to the power signal line pattern, and at least part of the first shielding pattern extends along the second direction, and orthographic projection of the first shielding pattern on the substrate overlaps orthographic projection of the data line pattern on the substrate;

the display panel further comprises:

a third auxiliary signal line layer, wherein the third auxiliary signal line layer includes a third auxiliary signal line pattern located in each of the plurality of sub-pixel areas, at least part of the third auxiliary signal line pattern extends along the first direction; in a same sub-pixel area, a fourth overlapping area is formed between orthographic projection of the third auxiliary signal line pattern on the substrate and orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled; in the same sub-pixel area, the first shielding pattern and the third auxiliary signal line pattern are formed as an integral structure.

2. The display panel according to claim 1, further comprising:

a power signal line layer, wherein the power signal line layer includes a power signal line pattern located in each of the plurality of sub-pixel areas, at least part of the power signal line pattern extends along the second direction;

in the same sub-pixel area, the orthographic projection of the power signal line pattern on the substrate is located between orthographic projection of the gate electrode of the driving transistor on the substrate and the orthographic projection of the data line pattern on the substrate.

3. The display panel according to claim 2, wherein the power signal line pattern includes a first power supply portion and a second power supply portion that are coupled to each other, and the first power supply portion extends along the second direction, the second power supply portion protrudes from the first power supply portion in a direction away from the data line pattern in the sub-pixel area where the second power supply portion is located; in a direction perpendicular to the second direction and parallel to a direction of the substrate, a width of the first power supply portion is greater than a width of the second power supply portion;

orthographic projection of the first electrode of the driving transistor on the substrate overlaps orthographic projection of the first power supply portion in the corresponding sub-pixel area on the substrate, and the first electrode of the driving transistor is coupled to the first power supply portion at the overlapping area.

4. A display panel, comprising: a substrate and a sub-pixel driving circuit film layer, a gate line layer, a data line layer, and a conductive connection portion layer disposed on the substrate, and a plurality of sub-pixel areas arranged in an array; wherein the gate line layer includes a gate line pattern located in each of the plurality of sub-pixel areas, and at least part of the gate line pattern extends along a first direction;

the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate;

the conductive connection portion layer includes a third conductive connection portion and a fourth conductive connection portion located in each of the plurality of sub-pixel areas;

the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate;

the display panel further comprises:

a power signal line layer, wherein the power signal line layer includes a power signal line pattern located in each of the plurality of sub-pixel areas, at least part of the power signal line pattern extends along the second direction;

in the same sub-pixel area, the orthographic projection of the power signal line pattern on the substrate is located between orthographic projection of the gate electrode of the driving transistor on the substrate and the orthographic projection of the data line pattern on the substrate;

wherein the power signal line pattern includes a first power supply portion and a second power supply portion that are coupled to each other, and the first power supply portion extends along the second direction, the second power supply portion protrudes from the first power supply portion in a direction away from the data line pattern in the sub-pixel area where the second power supply portion is located; in a direction perpendicular to the second direction and parallel to a direction of the substrate, a width of the first power supply portion is greater than a width of the second power supply portion;

orthographic projection of the first electrode of the driving transistor on the substrate overlaps orthographic projection of the first power supply portion in the corresponding sub-pixel area on the substrate, and the first electrode of the driving transistor is coupled to the first power supply portion at the overlapping area;

wherein the first electrode of the first transistor includes a first electrode portion and a second electrode portion that are coupled to each other, and the first electrode portion extends along the first direction, the second electrode portion extends along the second direction, orthographic projection of the second electrode portion on the substrate overlaps the orthographic projection of the data line pattern in the corresponding sub-pixel area on the substrate, and the second electrode portion is coupled to the data line pattern in the corresponding sub-pixel area through a first connection hole at the overlapping area; orthographic projection of the first connection hole on the substrate and the orthographic projection of the second power supply portion on the substrate are arranged in a direction perpendicular to the second direction.

5. A display panel, comprising: a substrate and a sub-pixel driving circuit film layer, a gate line layer, a data line layer, and a conductive connection portion layer disposed on the substrate, and a plurality of sub-pixel areas arranged in an array; wherein the gate line layer includes a gate line pattern located in each of the plurality of sub-pixel areas, and at least part of the gate line pattern extends along a first direction;

the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate;

the conductive connection portion layer includes a third conductive connection portion and a fourth conductive connection portion located in each of the plurality of sub-pixel areas;

the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate;

the display panel further comprises:

a power signal line layer, wherein the power signal line layer includes a power signal line pattern located in each of the plurality of sub-pixel areas, at least part of the power signal line pattern extends along the second direction;

in the same sub-pixel area, the orthographic projection of the power signal line pattern on the substrate is located between orthographic projection of the gate electrode of the driving transistor on the substrate and the orthographic projection of the data line pattern on the substrate;

wherein the power signal line pattern includes a first power supply portion and a second power supply portion that are coupled to each other, and the first power supply portion extends along the second direction, the second power supply portion protrudes from the first power supply portion in a direction away from the data line pattern in the sub-pixel area where the second power supply portion is located; in a direction perpendicular to the second direction and parallel to a direction of the substrate, a width of the first power supply portion is greater than a width of the second power supply portion;

orthographic projection of the first electrode of the driving transistor on the substrate overlaps orthographic projection of the first power supply portion in the corresponding sub-pixel area on the substrate, and the first electrode of the driving transistor is coupled to the first power supply portion at the overlapping area;

wherein the first electrode of the first transistor includes a first electrode portion and a second electrode portion that are coupled to each other, and the first electrode portion extends along the first direction, the second electrode portion extends along the second direction, orthographic projection of the second electrode portion on the substrate overlaps the orthographic projection of the data line pattern in the corresponding sub-pixel area on the substrate, and the second electrode portion is coupled to the data line pattern in the corresponding sub-pixel area through a first connection hole at the overlapping area;

orthographic projection of the first connection hole on the substrate and the orthographic projection of the second power supply portion on the substrate are arranged in a direction perpendicular to the second direction;

wherein orthographic projection of the first electrode portion on the substrate overlaps the orthographic projection of the first power supply portion in the corresponding sub-pixel area on the substrate; and/or, orthographic projection of a channel area of the first transistor on the substrate overlaps the orthographic projection of the first power supply portion in the corresponding sub-pixel area on the substrate.

6. The display panel according to claim 1, further comprising:

an initialization signal line layer, wherein the initialization signal line layer includes an initialization signal line pattern arranged in each of the plurality of sub-pixel areas;

an anode layer located on a side of the initialization signal line layer away from the substrate, wherein the anode layer includes a plurality of anode patterns corresponding to the plurality of sub-pixel areas in a one-to-one manner, and the plurality of anode patterns are arranged at intervals, an anode spacing area is formed between adjacent anode patterns;

a first auxiliary signal line layer, wherein the first auxiliary signal line layer has a grid structure, at least a part of the first auxiliary signal line layer is located in the anode spacing area and is insulated from the anode pattern, the initialization signal line pattern in each of the plurality of sub-pixel areas is coupled to the first auxiliary signal line layer.

7. The display panel according to claim 6, wherein the conductive connection portion layer further includes a first conductive connection portion arranged in each of the plurality of sub-pixel areas; in the same sub-pixel area, a first overlapping area is formed between the orthographic projection of the first conductive connecting portion on the substrate and the orthographic projection of the initialization signal line pattern on the substrate, a second overlapping area is formed between the orthographic projection of the first conductive connection portion on the substrate and the first auxiliary signal line layer; the first conductive connection portion is coupled to the initialization signal line pattern in the first overlapping area, and the first conductive connection portion is coupled to the first auxiliary signal line layer in the second overlapping area.

8. The display panel according to claim 6, wherein each initialization signal line pattern includes a first sub-pattern and a second sub-pattern, and in adjacent sub-pixel areas of the same row along the first direction, a second sub-pattern in a previous sub-pixel area and a first sub-pattern in a current sub-pixel area form an integral structure; the second sub-pattern is coupled to the first auxiliary signal line layer in each sub-pixel area.

9. The display panel according to claim 6, wherein the first auxiliary signal line layer and the anode layer are arranged at a same layer and made of a same material.

10. The display panel according to claim 1, further comprising:
a reset signal line layer, wherein the reset signal line layer includes a reset signal line pattern located in each of the plurality of sub-pixel areas, and a gate line pattern in a current sub-pixel area and a reset signal line pattern in an adjacent next sub-pixel area along the second direction are formed as an integral structure.

11. The display panel according to claim 1, further comprising:
a power signal line pattern, an initialization signal line pattern, a reset signal line pattern, and a light emitting control signal line pattern located in each of the plurality of sub-pixel areas; wherein
each of the sub-pixel driving circuits further includes: a fourth transistor, a fifth transistor, a sixth transistor, a seventh transistor, an eighth transistor, and a ninth transistor;
a first electrode of the first transistor is coupled to the corresponding data line pattern;
a first electrode of the second transistor is coupled to the second electrode of the driving transistor;
a first electrode of the driving transistor is coupled to the corresponding power signal line pattern;
a gate electrode of the fourth transistor is coupled to the corresponding reset signal line pattern, a first electrode of the fourth transistor is coupled to the corresponding initialization signal line pattern, and a second electrode of the fourth transistor is coupled to the gate electrode of the driving transistor;
a gate electrode of the fifth transistor is coupled to the corresponding reset signal line pattern, a first electrode of the fifth transistor is coupled to the corresponding initialization signal line pattern, and a second electrode of the fifth transistor is coupled to the second electrode plate of the storage capacitor;

a gate electrode of the sixth transistor is coupled to the corresponding light emitting control signal line pattern, a first electrode of the sixth transistor is coupled to the corresponding initialization signal line pattern, and a second electrode of the sixth transistor is coupled to the second electrode plate of the storage capacitor;
a gate electrode of the seventh transistor is coupled to the corresponding light emitting control signal line pattern, a first electrode of the seventh transistor is coupled to the second electrode of the driving transistor, and a second electrode of the seventh transistor is coupled to the corresponding anode pattern;
a gate electrode of the eighth transistor is coupled to the corresponding reset signal line pattern, a first electrode of the eighth transistor is coupled to the corresponding initialization signal line pattern, and a second electrode of the eighth transistor is coupled to the corresponding anode pattern;
a gate electrode of the ninth transistor is coupled to the corresponding light emitting control signal line pattern, a first electrode of the ninth transistor is coupled to the gate electrode of the third transistor, and a second electrode of the ninth transistor is floating.

12. A display device comprising the display panel according to claim 1.

13. A method of manufacturing a display panel, configured to manufacture the display panel according to claim 1, comprising:
forming a sub-pixel driving circuit film layer, a gate line layer, a data line layer and a conductive connection layer on a substrate, wherein,
the gate line layer includes a gate line pattern located in each of the plurality of sub-pixel areas, and at least part of the gate line pattern extends along a first direction;
the data line layer includes a data line pattern located in each of the plurality of sub-pixel areas, at least part of the data line pattern extends along a second direction, the first direction intersects the second direction, and orthographic projection of the data line pattern on the substrate overlaps orthographic projection of the gate line pattern on the substrate;
the conductive connection portion layer includes a third conductive connection portion and a fourth conductive connection portion located in each of the plurality of sub-pixel areas;
the sub-pixel driving circuit film layer includes sub-pixel driving circuits corresponding to the plurality of sub-pixel areas in a one-to-one manner, and each of the sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and a second electrode plate of the storage capacitor is coupled to a second electrode of the first transistor through the third conductive connection portion in the corresponding sub-pixel area, a gate electrode of the first transistor and a gate electrode of the second transistor are respectively coupled to the gate line pattern in the corresponding sub-pixel area; orthographic projection of the gate line pattern on the substrate does not overlap orthographic projection of the third conductive connecting portion on the substrate, and/or the orthographic projection of the gate line pattern on the substrate does not overlap orthographic projection of the fourth conductive connection portion on the substrate;

the method of manufacturing a display panel further comprises:

forming a power signal line layer, wherein the power signal line layer includes a power signal line pattern located in each of the plurality of the sub-pixel areas, at least part of the power signal line pattern extends along the second direction;

forming a first shielding layer, wherein the first shielding layer includes a first shielding pattern located in each of the plurality of sub-pixel areas, the first shielding pattern is coupled to the power signal line pattern, and at least part of the first shielding pattern extends along the second direction, and orthographic projection of the first shielding pattern on the substrate overlaps orthographic projection of the data line pattern on the substrate;

the method of manufacturing a display panel further comprises:

forming a third auxiliary signal line layer, wherein the third auxiliary signal line layer includes a third auxiliary signal line pattern located in each of the plurality of sub-pixel areas, at least part of the third auxiliary signal line pattern extends along the first direction; in a same sub-pixel area, a fourth overlapping area is formed between orthographic projection of the third auxiliary signal line pattern on the substrate and orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled; in the same sub-pixel area, the first shielding pattern and the third auxiliary signal line pattern are formed as an integral structure.

* * * * *